(12) United States Patent
Epple et al.

(10) Patent No.: US 9,279,969 B2
(45) Date of Patent: Mar. 8, 2016

(54) CATADIOPTRIC PROJECTION OBJECTIVE

(71) Applicant: Carl Zeiss SMT GmbH, Oberkochen (DE)

(72) Inventors: Alexander Epple, Aalen (DE); Vladimir Kamenov, Essingen (DE); Toralf Gruner, Aalen-Hofen (DE); Thomas Schicketanz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/510,454

(22) Filed: Oct. 9, 2014

(65) Prior Publication Data

US 2015/0055212 A1 Feb. 26, 2015

Related U.S. Application Data

(63) Continuation of application No. 13/871,366, filed on Apr. 26, 2013, now Pat. No. 8,873,137, which is a continuation of application No. 12/562,693, filed on Sep. 18, 2009, now Pat. No. 8,446,665.

(30) Foreign Application Priority Data

Aug. 13, 2009 (DE) .................. 10 2009 037 077

(51) Int. Cl.
*G02B 17/08* (2006.01)
*G03F 7/20* (2006.01)

(52) U.S. Cl.
CPC ............ *G02B 17/0892* (2013.01); *G02B 17/08* (2013.01); *G03F 7/70* (2013.01); *G03F 7/70225* (2013.01); *G03F 7/70275* (2013.01)

(58) Field of Classification Search
CPC G02B 17/0892; G02B 17/08; G03F 7/70225; G03F 7/70275; G03F 7/70

USPC .................. 359/351, 355, 359, 364, 726, 727; 356/399
See application file for complete search history.

(56) References Cited

U.S. PATENT DOCUMENTS

| | | | |
|---|---|---|---|
| 5,300,786 A | 4/1994 | Brunner et al. | |
| 5,963,365 A | 10/1999 | Shirai | |

(Continued)

FOREIGN PATENT DOCUMENTS

| | | | |
|---|---|---|---|
| CN | 101243360 | 8/2008 | ............... G03F 7/20 |
| EP | 1 152 263 | 11/2001 | |

(Continued)

OTHER PUBLICATIONS

Chinese Office Action for Application No. 201010254294.2 dated Dec. 4, 2013 (18 pages).

(Continued)

*Primary Examiner* — Frank Font
(74) *Attorney, Agent, or Firm* — Fish & Richardson P.C.

(57) ABSTRACT

Catadioptric projection objectives for microlithography include: a first partial objective for imaging an object field onto a first real intermediate image; a catadioptric partial objective having one concave mirror and a lens for imaging the first intermediate image onto a second real intermediate image; a third partial objective including an aperture stop and no more than four lenses between the aperture stop and an image field, the third partial objective for imaging the second intermediate image onto the image field; and a first folding mirror for deflecting the radiation from the object plane toward the concave mirror and a second folding mirror for deflecting the radiation from the concave mirror toward the image plane. The projection objective is an immersion projection objective. At least one surface of the lens in the catadioptric partial objective has an antireflection coating including at least six layers.

19 Claims, 18 Drawing Sheets

(56) References Cited

U.S. PATENT DOCUMENTS

| | | | |
|---|---|---|---|
| 5,993,898 A | 11/1999 | Nagatsuka | |
| 6,782,074 B2 | 8/2004 | Sakuma | |
| 6,995,833 B2 | 2/2006 | Kato et al. | |
| 6,995,930 B2 | 2/2006 | Shafer et al. | |
| 7,256,932 B2 * | 8/2007 | Epple et al. | 359/350 |
| 7,426,082 B2 | 9/2008 | Shafer et al. | |
| 7,466,489 B2 | 12/2008 | Beder et al. | |
| 7,929,115 B2 | 4/2011 | Mueller | |
| 8,004,755 B2 * | 8/2011 | Mann et al. | 359/365 |
| 8,125,613 B2 | 2/2012 | Suzuki | |
| 8,310,752 B2 | 11/2012 | Feldmann et al. | |
| 2001/0030740 A1 | 10/2001 | Mori et al. | |
| 2002/0044260 A1 | 4/2002 | Takahashi et al. | |
| 2002/0191288 A1 | 12/2002 | Gruner et al. | |
| 2003/0011755 A1 | 1/2003 | Omura et al. | |
| 2003/0058421 A1 | 3/2003 | Omura et al. | |
| 2003/0108665 A1 | 6/2003 | Biro et al. | |
| 2003/0234912 A1 | 12/2003 | Omura et al. | |
| 2005/0179994 A1 | 8/2005 | Webb | |
| 2005/0248856 A1 | 11/2005 | Omura et al. | |
| 2005/0280890 A1 | 12/2005 | Otani et al. | |
| 2006/0023538 A1 | 2/2006 | Nishihara et al. | |
| 2006/0077366 A1 | 4/2006 | Shafer et al. | |
| 2006/0082905 A1 * | 4/2006 | Shafer et al. | 359/727 |
| 2007/0002323 A1 | 1/2007 | Fukui et al. | |
| 2008/0037111 A1 | 2/2008 | Shafer et al. | |
| 2008/0117400 A1 | 5/2008 | Rostalski et al. | |
| 2008/0165336 A1 | 7/2008 | Omura et al. | |
| 2008/0174858 A1 | 7/2008 | Feldmann et al. | |
| 2008/0297884 A1 | 12/2008 | Mueller | |
| 2008/0304036 A1 | 12/2008 | Omura | |
| 2009/0034061 A1 | 2/2009 | Dodoc et al. | |
| 2009/0046268 A1 | 2/2009 | Omura et al. | |
| 2009/0086179 A1 | 4/2009 | Hult et al. | |
| 2009/0092925 A1 | 4/2009 | Omura | |
| 2009/0115986 A1 | 5/2009 | Feldmann et al. | |
| 2009/0128896 A1 | 5/2009 | Dodoc | |
| 2011/0222043 A1 | 9/2011 | Kamenov et al. | |
| 2012/0162625 A1 | 6/2012 | Dodoc et al. | |

FOREIGN PATENT DOCUMENTS

| | | | |
|---|---|---|---|
| EP | 1 316 848 | 6/2003 | |
| JP | 10-319209 | 12/1998 | |
| JP | 2002-083766 | 3/2002 | ............ H01L 21/027 |
| JP | 2003-077827 | 3/2003 | ............ H01L 21/027 |
| JP | 2003-161708 | 6/2003 | |
| JP | 2003-307679 | 10/2003 | ............ G02B 17/08 |
| JP | 2004-302113 | 10/2004 | |
| JP | 2005-039211 | 2/2005 | ............ H01L 21/027 |
| JP | 2005-512151 | 4/2005 | ............ G02B 17/08 |
| JP | 2005-148551 | 6/2005 | |
| JP | 2005-536775 | 12/2005 | ............ G02B 17/08 |
| JP | 2006-003540 | 1/2006 | |
| JP | 2006-048779 | 2/2006 | ............ G11C 16/06 |
| JP | 2006-058779 | 3/2006 | |
| JP | 2006-113533 | 4/2006 | ............ G02B 17/08 |
| JP | 2006-201700 | 8/2006 | |
| JP | 2007-523383 | 8/2007 | ............ G02B 17/08 |
| JP | 2007-538277 | 12/2007 | ............ G02B 17/08 |
| JP | 2008-529094 | 7/2008 | ............ G02B 17/08 |
| JP | 2008-181125 | 8/2008 | ............ G02B 13/24 |
| JP | 2009-507366 | 2/2009 | ............ H01L 21/027 |
| WO | WO 01/23914 | 4/2001 | |
| WO | WO 01/65296 | 9/2001 | ............ G02B 17/08 |
| WO | WO 2003/003429 | 1/2003 | ............ H01L 21/027 |
| WO | WO 2003/036361 | 5/2003 | ............ G02B 13/24 |
| WO | WO 2006/121008 | 11/2006 | ............ H01L 21/027 |
| WO | WO 2007/091463 | 8/2007 | ............ G02B 17/08 |
| WO | WO 2007/132619 | 11/2007 | ............ G02B 13/24 |
| WO | WO 2008/019803 | 2/2008 | ............ G03F 7/20 |
| WO | WO 2008/104192 | 9/2008 | ............ G02B 17/08 |
| WO | WO 2009/030444 | 3/2009 | ............ G02B 17/08 |

OTHER PUBLICATIONS

Japanese Office Action for Application No. 2012-219282, dated Sep. 26, 2013 (6 pages).
Office Action for German Application No. 10 2009 037 077.3-51 dated Feb. 4, 2010 (6 pages).
Response to Office Action for German Application No. 10 2009 037 077.3-51 dated Jul. 22, 2010 (41 pages).
Decision to Grant for German Application No. 10 2009 037 077.3-51 dated Oct. 21, 2010 (72 pages).
First Office Action for Japanese Application No. 2010-194864 dated Oct. 11, 2011 (3 pages).
Final Rejection for Japanese Application No. 2010-194864 dated May 22, 2012 (2 pages).
Official Action for Japanese Application No. 2010-194864 dated Jan. 17, 2013 (3 pages).
Office Action for Japanese Application No. 2012-091857 dated Jul. 30, 2013 (2 pages).

* cited by examiner

CATADIOPTRIC PROJECTION OBJECTIVE

This application is a Continuation application based on U.S. application Ser. No. 13/871,366, filed on Apr. 26, 2013, which is a continuation of application Ser. No. 12/562,693 filed on Sep. 18, 2009, which claims priority to German Patent Application No. 10 2009 037 077.3, filed on Aug. 13, 2009, the respective entire disclosures of which are incorporated into the present application by reference.

FIELD OF AND BACKGROUND OF THE INVENTION

The invention relates to a catadioptric projection objective for imaging an object field in an object plane onto an image field in an image plane including three partial objectives, to a projection exposure apparatus for microlithography including such a projection objective and also to a method for producing semiconductor components and other finely structured components using such a projection exposure apparatus.

The object field is imaged onto a first real intermediate image by the first partial objective of the catadioptric projection objective, the first intermediate image is imaged onto a second real intermediate image by the second partial objective, and the second intermediate image is finally imaged onto the image field in the image plane by the third partial objective. In this case, the second partial objective is a catadioptric objective having exactly one concave mirror. Moreover, the catadioptric projection objective has two folding mirrors, wherein the first folding mirror deflects the projection light from the object plane toward the concave mirror of the second partial objective and the second folding mirror deflects the projection light from the concave mirror of the second partial objective toward the image plane. The folding mirrors can be embodied, e.g., either as separate elements or as two side surfaces of a unitary body, such as a prism covered with an appropriate reflection coating or coatings.

Catadioptric projection objectives of this type are known for example from US 2009/0034061 and from US 2009/0092925.

OBJECTS AND SUMMARY OF THE INVENTION

At the lens surfaces of the lenses of the catadioptric projection objective, a specific proportion of the light is reflected on account of the difference in refractive index between air, or the gas filling, and the lens material. Although this reflection can be reduced by antireflection coatings, it cannot be completely prevented. If the projection light reflected at lens surfaces passes into the image plane, this so-called stray light leads to a background illumination that reduces the contrast of the actual image.

It is an object of the invention, then, to reduce the stray light in such projection objectives.

This involves investigating the light paths on which light can pass into the image plane in this class of projection objectives. A light path is understood to mean the sequence of optical surfaces which the light passes through on the way from the object plane to the image plane. In this case, a distinction is made between the projection light path, along which the projection light is intended to pass through the optical surfaces of lenses or mirrors in accordance with the optical design of the catadioptric projection objective, and one or more stray light paths, along which the stray light passes into the image plane. In the case of a stray light path, the stray light is reflected instead of transmitted at at least one lens surface and thus leaves the projection light path. For determining the stray light paths, each lens surface is regarded both as a transmissive surface and as a reflective surface, wherein the reflectance of the lens surface governs the probability with which a light beam is transmitted or reflected. From an alternative standpoint, the light beam can be split into a transmitted and a reflected light beam, the reflectance determining the intensities of the two beams. Depending on how often the stray light is reflected at lens surfaces within the projection objective, a distinction is made between single reflections, double reflections, or even higher-order reflections. Since the intensity of the reflections is dependent on the product of the reflectivities, single reflections with just one reflection lead to a comparatively high stray light intensity. Therefore, each single reflection has to be investigated with regard to whether it can be afforded tolerance or whether corresponding measures for reducing the stray light intensity on account of the single reflection are necessary.

By virtue of the second partial objective having exactly one concave mirror and by virtue of the fact that the projection light is deflected toward this concave mirror by the first folding mirror and, after reflection at the concave mirror, is deflected toward the image plane by the second folding mirror, the lenses of the second partial objective between the folding mirrors and the concave mirror are passed through twice. The projection light therefore passes through such a lens that is passed through twice a first time on the way to the concave mirror and a second time after reflection at the concave mirror. The lens surfaces of such lenses that are passed through twice can bring about single reflections by virtue of the projection light being reflected instead of transmitted at one of the lens surfaces. In this case, a stray light path can form by virtue of optical surfaces being skipped which the projection light would otherwise pass through on the way toward the concave mirror and back again. Under certain circumstances, the stray light path can reach as far as the image plane. The stray light then passes through all those optical surfaces which the projection light would also pass through after reflection at the concave mirror starting from the reflective lens surface. The lenses of the second partial objective which are passed through twice are therefore particularly prone to generating stray light in the image plane on account of single reflections.

In one aspect of the invention, at least one surface of a lens of the second partial objective is provided with an antireflection coating having a reflectivity of less than 0.2% for an operating wavelength of between 150 nm and 250 nm and for an angle-of-incidence range of between 0° and 30°. An antireflection coating is understood to mean a coating which is designed such that the reflection loss on account of the sudden change in refractive index when the light enters the lens is reduced relative to the reflection loss that arises if this coating is not provided. In this case, the antireflection coatings provided here are specified firstly by an operating wavelength and secondly by an angle-of-incidence range. The operating wavelength is understood to mean the wavelength of the projection light at which the projection objective is operated. This is typically a wavelength in the DUV or VUV wavelength range between 150 nm and 250 nm, that is to say for example 248 nm, 193 nm or 157 nm. An angle of incidence is understood to mean the angle of a ray of light with respect to the surface normal at the point where the ray of light impinges on the lens surface. In general, many rays impinge on a point of the lens surface with different angles of incidence, such that an antireflection coating has to be optimized not only for one angle of incidence, but for an entire angle-of-incidence range. In this case, it is not possible to produce an antireflection coating which completely prevents reflection at the lens surface; such reflection can only be reduced. In this case, the degree of complexity of the antireflection coating increases with the degree of reduction of the residual reflection for a predetermined angle-of-incidence range. In general, it suffices to design antireflection coatings for reducing the stray light effects as a result of double or multiple reflections since double and multiple reflections predominate in projection objectives without lenses that are passed through twice. A reflectivity of the antireflection coating within the angle-of-incidence range of for example greater than 0.2% is sufficient for reducing double and multiple reflections in a manner that can be afforded tolerance. Further reduction of the reflectivity would make the antireflection coating unnecessarily complex. If, by contrast, a stray light path which ends within the image field already arises for a single reflection, then a reflectivity of the antireflection coating within the angle-of-incidence range of greater than 0.2% can lead to stray light that cannot be afforded tolerance. Precisely this risk is manifested, however, in the case of the lenses of the second partial objective which are passed through twice. At least one lens surface of the lenses of the second partial objective is therefore covered with an antireflection coating having a reflectivity of less than 0.2% for the angle-of-incidence range of 0° to 30° that is relevant to these lenses.

In a further aspect of the invention, the antireflection coating has a reflectivity of less than 0.1% for a wavelength of between 150 nm and 250 nm and for an angle-of-incidence range of between 0° and 30°.

Since, for rays having small angles of incidence in the range of 0° to 20°, that is to say rays near to the optical axis, the probability of nevertheless passing into the image plane after reflection at a lens surface and contributing to the background illumination is particularly high, in a further aspect of the invention, the lens surfaces of the lenses of the second partial objective which are passed through twice are covered with antireflection coatings having a reflectivity of less than 0.1% for an angle-of-incidence range of 0° to 20° and for a wavelength of between 150 nm and 250 nm.

In one embodiment of the invention, the antireflection coating has a reflectivity of less than 0.05% for a wavelength of between 150 nm and 250 nm and for an angle-of-incidence range of between 0° and 20°.

In a further embodiment of the invention, the antireflection coating has a reflectivity of less than 0.02% for a wavelength of between 150 nm and 250 nm and for an angle-of-incidence range of between 0° and 10°.

In a further embodiment of the invention, the antireflection coating has a reflectivity of less than 0.2% for a wavelength of between 150 nm and 250 nm and for an angle-of-incidence range of between 0° and 30° and simultaneously a reflectivity of less than 0.1% for an angle-of-incidence range of between 0° and 20°.

In a further embodiment of the invention, the antireflection coating has a reflectivity of less than 0.2% for a wavelength of between 150 nm and 250 nm and for an angle-of-incidence range of between 0° and 30°, a reflectivity of less than 0.1% for an angle of incidence range of between 0° and 20° and simultaneously a reflectivity of less than 0.02% for an angle-of-incidence range of between 0° and 10°.

The complexity of an antireflection coating is manifested, inter alia, in the number of employed layers from which the antireflection coating is constructed. In one embodiment of the invention, the antireflection coating includes six layers composed alternately of material having a high refractive index and material having a low refractive index. In this case, a material is designated as having a high refractive index when it has, for the operating wavelength, a higher refractive index than the refractive index of the material having a low refractive index.

In a further embodiment of the invention, the antireflection coating has seven layers composed alternately of material having a high refractive index and material having a low refractive index.

Owing to the use of at least six layers composed alternately of material having a high refractive index and material having a low refractive index, it is possible to ensure a reflectivity of less than 0.2% over the angle-of-incidence range of 0° to 30°.

In one embodiment of the invention, the employed material having a low refractive index is a dielectric material selected from the group consisting of magnesium fluoride, aluminum fluoride, sodium fluoride, lithium fluoride, calcium fluoride, barium fluoride, strontium fluoride, cryolite, chiolite, and combinations thereof.

In one embodiment of the invention, the employed material having a high refractive index is a dielectric material selected from the group consisting of neodymium fluoride, lanthanum fluoride, gadolinium fluoride, dysprosium fluoride, aluminum oxide, lead fluoride, yttrium fluoride, and combinations thereof.

For the arising of single reflections on account of the reflection at surfaces of the second partial objective, consideration should be given particularly to those surfaces which have a deviation of the marginal ray concentricity of less than 20°. Marginal ray concentricity is understood to mean the state in which a marginal ray is reflected back on itself on a lens surface. That is to say that the marginal ray has an angle of incidence of 0° at the lens surface. In this case, the marginal ray employed is a fictitious ray which emerges in the object plane from the optical axis and just passes through the aperture stop of the projection objective, that is to say has in the image plane an angle of incidence corresponding to the maximum numerical aperture. It is a fictitious marginal ray because this class of projection objectives has an off-axis object field, that is to say that the optical axis of the projection objective does not intersect the object plane within the object field. This fictitious marginal ray can nevertheless be traced mathematically since, for the ray tracing, the physical boundary of mirrors or lenses or the vignetting by other optical elements is unimportant, rather the marginal ray is traced along the projection light path. What, then, is the relationship between the marginal ray concentricity of a lens surface and the production of a single reflection? In the case of ideal imaging, the marginal ray emerging from the object plane intersects the optical axis in the following image planes, that is to say, in the case of this class of projection objectives, in the plane of the first intermediate image, in the plane of the second intermediate image and in the image plane. If marginal ray concentricity then exists for a lens surface in the second partial objective, the marginal ray is reflected back on itself and thus intersects the optical axis again at the same location from which the marginal ray emerged. A so-called stray light intermediate image plane thus arises, which coincides with the first intermediate image plane. Since the first intermediate image is an off-axis intermediate image, the first intermediate image and the stray light intermediate image are situated on opposite sides of the optical axis. The stray light intermediate image is thus located within the projection light path from the concave mirror to the image plane, such that it is possible for the stray light to pass into the image plane in a manner following the projection light path. If the second partial objective is a 1:1 objective, moreover, then the first and second intermediate image planes and thus also the stray light intermediate image plane coincide. The stray light intermediate image is consequently generated at the location of the second intermediate image and ultimately imaged into the image plane by the third partial objective like the second intermediate image. A continuous stray light path right into the image plane arises on account of a single reflection. Lens surfaces for which marginal ray concentricity exists or for which the deviation from the marginal ray concentricity is less than 20° are therefore particularly critical for the production of single reflexes and should therefore be provided with the improved antireflection coating.

In addition to the improved antireflection coating of surfaces which are susceptible to single reflections, the reduction of the single reflections can already be taken into account when devising the optical design of the projection objective. Thus, in a further aspect of the invention, all the surfaces of the lenses of the second partial objective are configured such that their deviation from the marginal ray concentricity is greater than or equal to 20°. As a result, the stray light intermediate image is not generated at the location of the second intermediate image and consequently, unlike the second intermediate image itself, is not imaged into the image plane by the third partial objective. Stray light and projection light have different beam extents particularly in the region of the second folding mirror. Since the extent of the second folding mirror is adapted to the extent of the projection light beam, the stray light beam is vignetted by the physical boundary of the second folding mirror and, as a result, does not reach the image plane, or reaches the image plane only with a greatly reduced intensity.

For correction of the image field curvature and for chromatic correction, the second partial objective can have a plurality of lenses. These lenses which are passed through twice can have surfaces which lead to single reflections. In one embodiment of the invention, the second partial objective has exactly one lens. This reduces the number of surfaces to two surfaces at which single reflections can arise.

In order, however, that the imaging quality of the projection objective is not impaired owing to the reduction of the number of lenses in the second partial objective, in one embodiment of the invention, this lens is embodied as a bi-aspherical lens. In other words, this lens has an aspherical surface formed both on the front surface and on the back surface. Further degrees of freedom are thereby obtained for ensuring the required imaging quality.

As such, the background illumination in the image plane owing to stray light can be significantly reduced overall through: (i) the targeted configuration of the lens surfaces of the lenses of the second partial objective for avoiding single reflections, (ii) covering lens surfaces that are critical for single reflections with improved antireflection coatings, or (iii) a combined application of these two measures. In order to quantify the influence of the lens surfaces of the second partial objective on the stray light and the reduction thereof by the measures proposed, the stray light is measured for example by arranging a non-luminous object within the homogeneously illuminated object field and imaging the object into the image plane. In this case, the object is square, for example, and can have different edge lengths. The object is for example a small box that absorbs the projection light. Without stray light, the object would be sharply imaged into the image plane, such that the intensity within the image of the object is 0% of the maximum value of the ambient illumination. With stray light, however, the image of the object is not dark. The stray light intensity distribution can be determined from the intensity in the center of the image of the object, taking account of the dimensions of the object.

The intensity of the stray light in the center of the image of the object varies depending on the illumination of the object and the origin of the stray light. The illumination of the object can be characterized by the pupil filling factor $\sigma$, inter alia. In the case of a pupil filling factor of $\sigma=0.2$, the entrance pupil of the projection objective is illuminated only to a radius of 20% of the maximum pupil radius. Consequently, the object is only illuminated by rays which have relatively small angles with respect to the optical axis. In the case of a pupil filling factor of $\sigma=1.0$, by contrast, the entrance pupil of the projection objective is fully illuminated, such that the object is illuminated by rays which assume the maximum possible values in the object plane. If the object is illuminated with a small pupil filling factor, then the contribution of the stray light on account of single reflections is greater than in the case of illumination with a large pupil filling factor, since, for rays, having large angles with respect to the optical axis, there is a greater probability of not passing right into the image plane after reflection at a lens surface, but rather of being vignetted, for example at a lens mount. The stray light measurement is therefore carried out for example for a pupil filling factor of $\sigma=0.2$. If the illumination system of the projection exposure apparatus does not provide this filling factor, then a pupil filling factor of between $\sigma=0.2$ and $\sigma=0.3$ is used for the stray light measurement.

In addition to the single reflections caused by the lens surfaces of the second partial objective there are also further causes of stray light within the image field in the image plane. Double reflections, on account of the double reflection at lens surfaces, have a negligible intensity in comparison with single reflections. The stray light owing to surface or volume scattering can be distinguished from stray light on account of single reflections by choosing the edge length of the object to be large enough, for example 1.0 mm. The intensity of the stray light owing to surface or volume scattering in the center of the image of the object is then at least 70% lower in comparison with the intensity of the stray light on account of the single reflections. If the edge length were increased further, then although the separation of stray light owing to surface or volume scattering from stray light on account of single reflections would be better, the measurement signal for stray light on account of single reflections would then also decrease. If an object having an edge length of 1.0 mm is not available, then the measurement can also be carried out for an edge length of between 0.8 mm and 1.2 mm. Upon application of the proposed measures for reducing the single reflections on the lens surfaces of the second partial objective, the stray light intensity in the center of the image of the object is less than 1.1% in the stray light measurement with a square object having the edge length of between 0.8 mm and 1.2 mm and in the case of a pupil filling factor of between $\sigma=0.2$ and $\sigma=0.3$.

In one embodiment, the stray light intensity in the center of the image of the object is less than 0.9% in the stray light measurement with a square object having the edge length of between 0.8 mm and 1.2 mm and in the case of a pupil filling factor of between $\sigma=0.2$ and $\sigma=0.3$.

In a further embodiment, the stray light intensity in the center of the image of the object is less than 0.5% in the stray light measurement with a square object having the edge length of between 0.8 mm and 1.2 mm and in the case of a pupil filling factor of between $\sigma=0.2$ and $\sigma=0.3$.

The contribution of the lens surfaces of the second partial objective to the stray light can also be determined by measuring the stray light in the image plane within the image field for two different pupil filling factors and by determining the variation of the stray light, since the formation of the single reflections is greatly dependent on the pupil filling factor. Other causes of the stray light in the image plane such as, for example, surface or volume scattering exhibit, by contrast, a low dependence on the pupil filling factor and lead to an almost illumination-independent background illumination in comparison with single reflections. The stray light measurement is therefore carried out, for example, firstly by a pupil filling factor of $\sigma=1.0$ and secondly for a pupil filling factor of $\sigma=0.2$. If the illumination system of the projection exposure apparatus does not provide these filling factors, then a pupil filling factor of between $\sigma=0.8$ and $\sigma=1.0$ and, respectively, between $\sigma=0.2$ and $\sigma=0.3$ is used for the stray light measurement. If the proposed measures for reducing the single reflections are applied to the lens surfaces of the second partial objective, then the maximum difference between the stray light intensity for a pupil filling factor of between $\sigma=0.2$ and $\sigma=0.3$ and the stray light intensity for a pupil filling factor of between $\sigma=0.8$ and $\sigma=1.0$ for an image point within the image field is less than 0.3%.

In one embodiment of the invention, the second partial objective has an absolute value of the imaging scale of between 0.8 and 1.25. The second partial objective thus images the first intermediate image substantially 1:1 onto the second intermediate image.

In one embodiment of the invention the concave mirror of the second partial objective is arranged in the region of a pupil plane, the position of which results from the point of intersection of a paraxial principal ray with the optical axis of the projection objective. In this case, the concave mirror is arranged in the region of a pupil plane when the maximum height of all the principal rays emerging from the object field at the concave mirror is less than 20% of the diameter of the optically utilized region of the concave mirror.

If the second partial objective has, on the one hand, an absolute value of the imaging scale of between 0.8 and 1.25 and, on the other hand, a concave mirror in the region of the pupil plane, then a substantially symmetrical construction results for the second partial objective in relation to the concave mirror. If a lens surface at the second partial objective then has no or only a small deviation from the marginal ray concentricity, the stray light reflected at this lens surface generates a stray light intermediate image which coincides at least approximately with the second intermediate image and is thus imaged into the image plane by the third partial objective. This construction of the second partial objective which admittedly is favorable for the correction of the image field curvature and of chromatic aberrations, can lead, however, to single reflections that cannot be afforded tolerance. The single reflections can then be reduced by the targeted deviation from the marginal ray concentricity at the lens surfaces or by covering the lens surfaces with the improved antireflection coating.

According to another aspect of the invention, the second intermediate image is arranged in the region of the second folding mirror. In this case, the second intermediate image is arranged in the region of the second folding mirror when, in a fictitious plane which is arranged perpendicular to the optical axis and which has the same point of intersection with the optical axis as the second folding mirror, half the radial distance from the optical axis to that principal ray which emerges from an object point within the object field with maximum distance from the optical axis is greater than the radial distance of the marginal ray. The marginal ray already defined for determining the marginal ray concentricity is used in this case. As soon as a stray light intermediate image is not situated on the second intermediate image in this case, the stray light beam is vignetted by the physical boundary of the second folding mirror and the stray light intensity of this single reflection is reduced.

In a further aspect of the invention all the lenses in the second partial objective are arranged nearer to the concave mirror than to the first intermediate image or than to the second intermediate image. Since the lenses of the second partial objective are extended along the optical axis, for determining the lens distance the midpoint between the two lens vertices is determined and the distance is measured from the midpoint. In this case, the position of the two intermediate images results from the paraxial position of the intermediate images. By virtue of the lenses of the second partial objective being arranged nearer to the concave mirror than to the intermediate images, they are also further away from the second folding mirror. The greater the distance of the lens surfaces with respect to the second folding mirror, however, the greater the vignetting effect of the second folding mirror on account of the physical barrier thereof if the stray light intermediate image does not ideally coincide with the second intermediate image.

In yet another aspect of the invention, the catadioptric projection objective is part of a projection exposure apparatus for microlithography having, besides the projection objective, an illumination system for illuminating the object field in the object plane.

In order to produce semiconductor components and other finely structured components with the projection exposure apparatus, provision is made for a reticle having a predetermined pattern in the object plane of the catadioptric projection objective and for a wafer having a light-sensitive layer in the image plane of the catadioptric projection objective, the reticle is illuminated by the illumination system and, finally, the illuminated region of the reticle is imaged onto the wafer by the catadioptric projection objective.

BRIEF DESCRIPTION OF THE DRAWINGS

Details and aspects of the invention are explained more specifically below on the basis of the exemplary embodiments illustrated in the figures, in which.

DETAILED DESCRIPTION OF EXEMPLARY EMBODIMENTS

Figure 1:
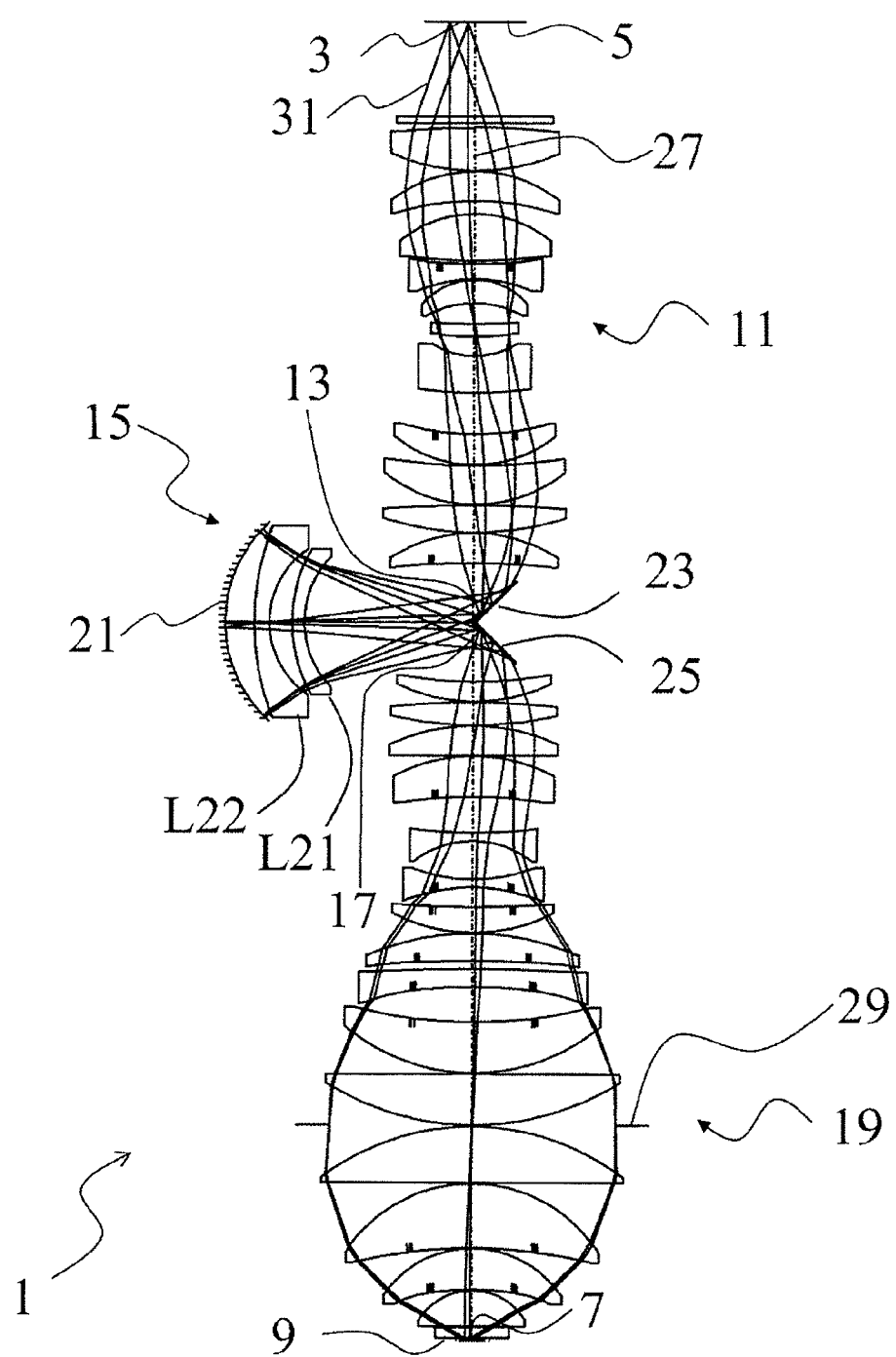
FIG. 1 shows the lens section of a catadioptric projection objective together with the projection light path.

FIG. 1 shows the lens section of a catadioptric projection objective 1. The optical design of the projection objective 1 has been taken from the patent application US2009/0092925A1 in the name of Omura, published on 9 Apr. 2009, and corresponds to FIG. 4 therein. The optical data of the design are summarized in Table 1 in US2009/0092925A1. For a more detailed description of the optical design of the projection objective 1, therefore, reference is made to US2009/0092925A1, which is hereby incorporated into the present application by reference. The projection objective 1 images the object field 3 in the object plane 5 onto the image field 7 in the image plane 9. It includes a first partial objective 11, which images the object field 3 on to the first real intermediate image 13, the second partial objective 15, which images the first intermediate image 13 on to the second real intermediate image 17, and the third partial objective 19, which images the second intermediate image 17 onto the image field 7. The second partial objective 15 is embodied as a catadioptric objective having the concave mirror 21 and the two lenses L21 and L22. The folding mirror 23 is arranged in the region of the first intermediate image 13, the folding mirror deflecting the projection light 31 from the object plane 5 toward the concave mirror 21. The folding mirror 25 is arranged in the region of the second intermediate image 17, this folding mirror deflecting the projection light from the concave mirror 21 toward the image plane 9.

Figure 2:
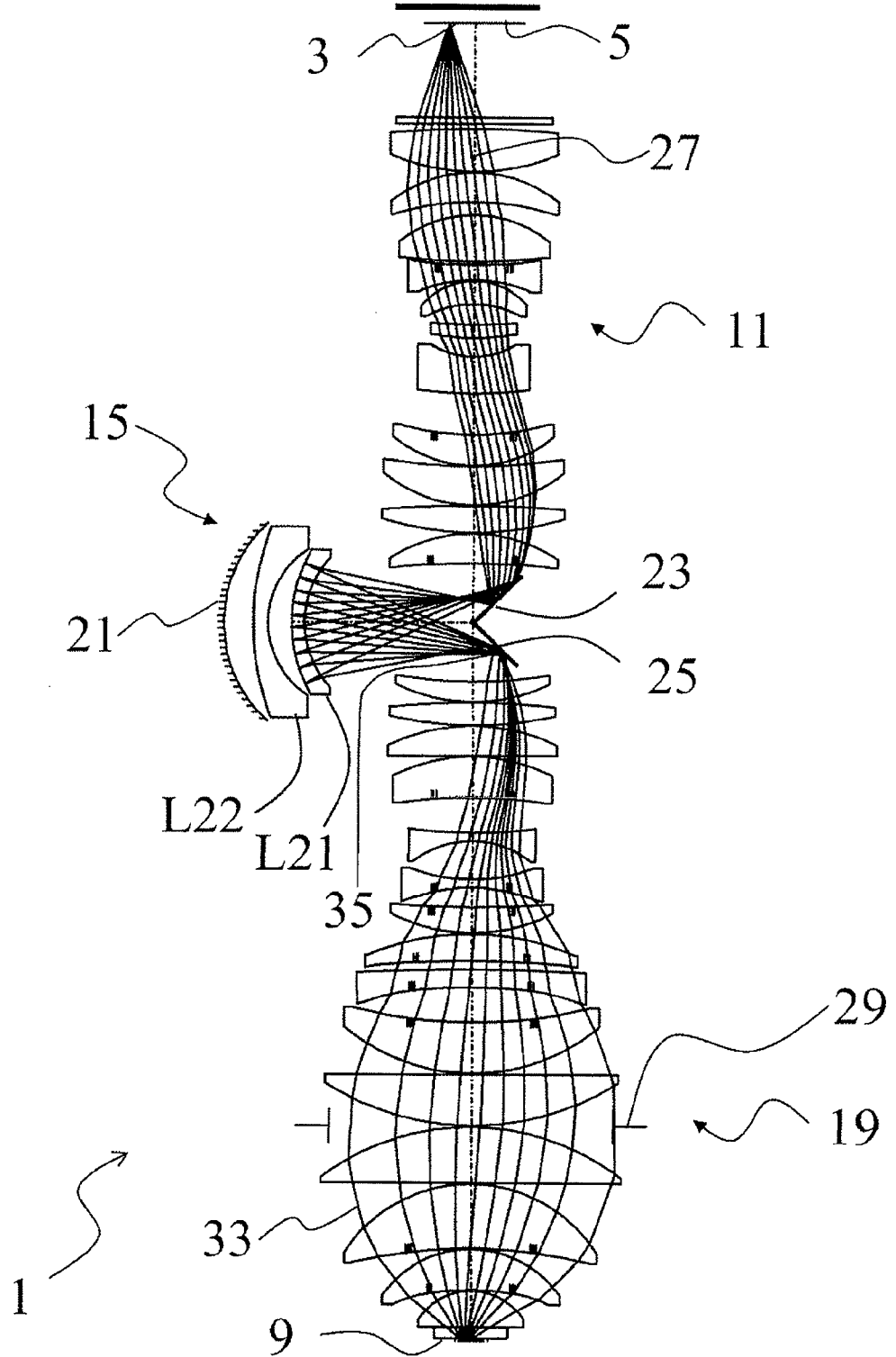
FIG. 2 shows the lens section of the projection objective from FIG. 1 together with a stray light path.

A stray light analysis was carried out for the projection objective 1 in order to determine the stray light paths on which the stray light can pass into the image plane 9 as single, double or multiple reflection and lead to a background illumination there. FIG. 2 shows for the projection objective 1 such a stray light path 33 arising from the fact that the projection light 31 is reflected at that surface of the lens L21 which faces the concave mirror 21, the surface being referred to hereinafter as back surface of the lens L21. In the stray light path 33 illustrated, the stray light 33, deviating from the projection light path 31, does not pass through the lens L22 and the concave mirror 21, but passes through all further optical surfaces which the projection light 31 would also pass through if the projection light 31 entered into the lens L21 again after reflection at the concave mirror 21 and after passing through the lens L22. In the stray light path 33, the stray light intermediate image 35 arises in the region of the folding mirror 25 and therefore simultaneously also virtually at a location of the second intermediate image 17. As a result, virtually the entire stray light is reflected at the second folding mirror 25 without being vignetted by the physical boundary of the folding mirror 25, and, in a manner similar to the projection light 31, passes through the third partial objective 19 as far as the image plane 9. The aperture stop 29 is virtually completely illuminated by the stray light, such that it is also not possible to filter out the stray light with a spatially delimited diaphragm in the region of the aperture stop plane without the projection light 31 being significantly vignetted.

The back surface of the lens L21 consequently produces a single reflection with very high stray light intensity. In this case, the stray light intensity corresponds approximately to the intensity of the projection light multiplied by the reflectivity of the back surface of the lens L21. This strong single reflection arises because the back surface of the lens L21 has a marginal ray concentricity of 0.6°. Therefore, virtually marginal ray concentricity is provided. Together with the fact that the second partial objective 15 has an absolute value of the imaging scale of 1.03 and the concave mirror 21 is arranged in the region of a pupil plane, the stray light intermediate image 35 is thereby generated virtually at the location of the second intermediate image 17 and the stray light 33 is thus transmitted almost completely via the second folding mirror 25.

The front surface of the lens L21, with a value of 15.9°, likewise has a low marginal ray concentricity, with the result that this surface also makes a contribution to the stray light in the image plane 9. The marginal ray concentricity of the back surface of the lens L22, which faces the concave mirror 21, is 24.0°, and the marginal ray concentricity of the front surface of the lens L22 is 22.9°, with the result that although these two surfaces likewise contribute to the stray light in the image plane 9, the magnitude of their contribution falls far short of that of the back surface of the lens L21. Very generally, the lenses L21 and L22 of the second partial objective 15 should be regarded as susceptible to stray light since both lenses are lenses which are passed through twice and through which the projection light 31 passes both on the light path toward the concave mirror 21 and on the light path away from the concave mirror 21. As soon as a stray light ray reflected at the lens surfaces of these lenses L21 and L22 that are passed through twice passes through the second folding mirror 25, there is the possibility of such a stray light ray reaching the image plane 9 and contributing to the extraneous light. This is a fundamental problem of this class of projection objectives.

Figure 3:
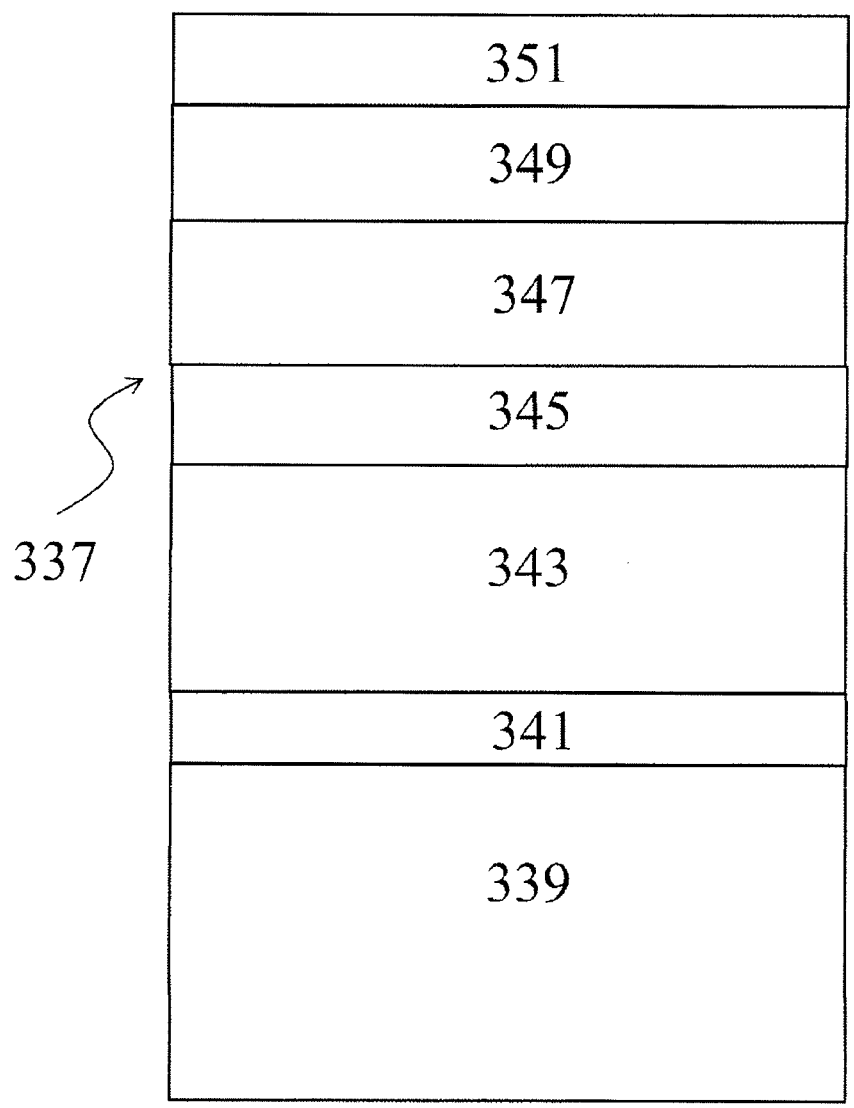
FIG. 3 shows a schematic illustration of an antireflection coating.
Figure 4:
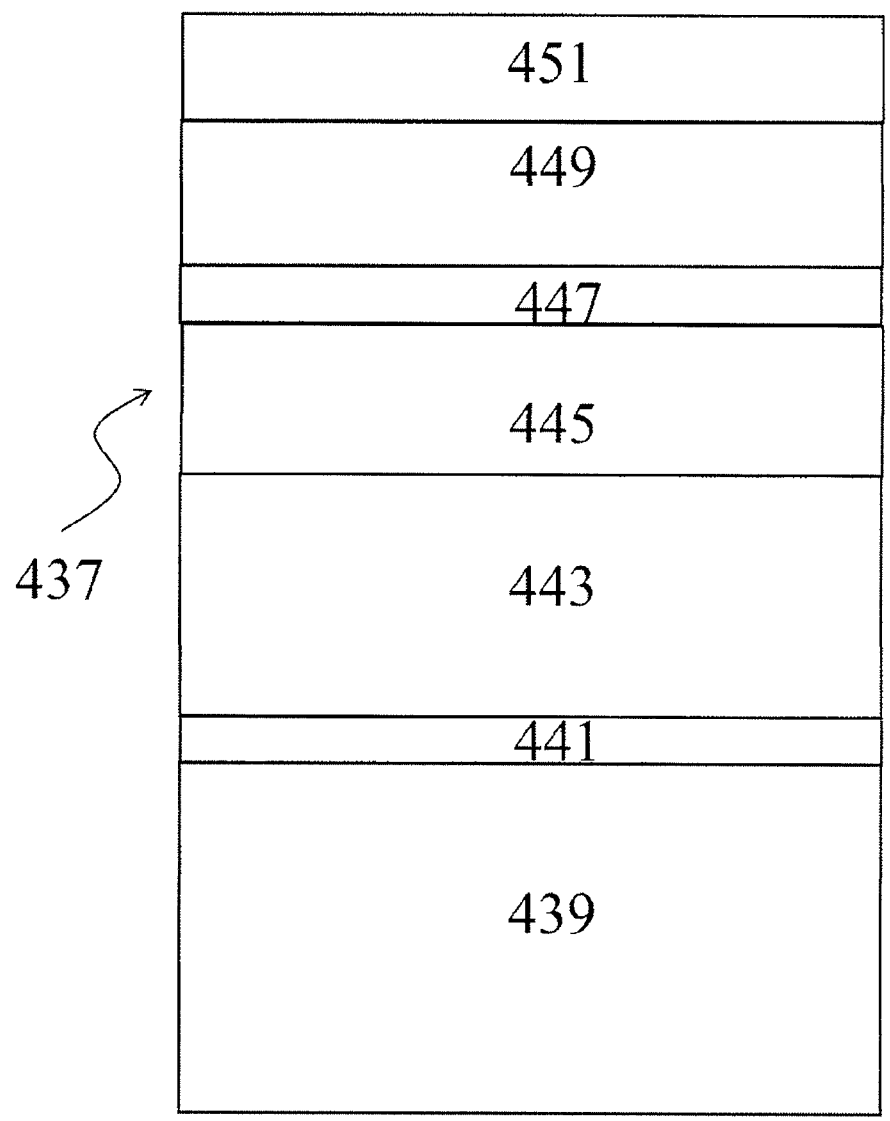
FIG. 4 shows a schematic illustration of an antireflection coating.
Figure 5:
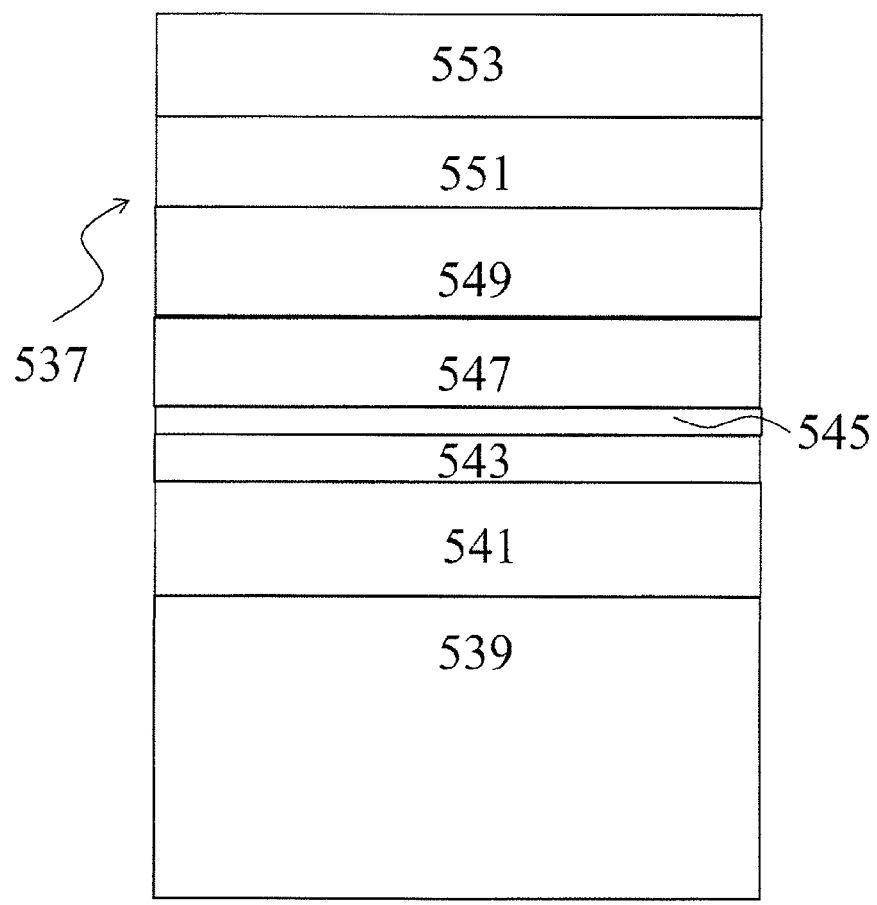
FIG. 5 shows a schematic illustration of an antireflection coating.

In the case of single reflections, the intensity of the stray light in the image plane 9 is linearly dependent on the reflectivity of that lens surface at which the stray light is reflected. The lens surfaces of the lenses L21 and L22 that are passed through twice in the projection objective 1 are covered therefore with an antireflection coating having a reflectivity of less than 0.2% for the projection light wavelength of 193.3 nm and for an angle of incidence range of between 0° and 30°. FIGS. 3 to 5 illustrate various exemplary embodiments of such an antireflection coating.

FIG. 3 shows in a schematic illustration the layer sequence of the antireflection coating 337 proceeding from the substrate 339 of the lens, this substrate being composed of quartz ($SiO_2$). The antireflection coating 337 includes six layers composed alternately of material having high refractive index and material having a low refractive index. Magnesium fluoride ($MgF_2$) is used as material having a low refractive index. Lanthanum fluoride ($LaF_3$) is used as material having a high refractive index. The geometrical thicknesses of the individual layers, the materials and the refractive indices thereof and also the reference signs used in FIG. 3 are indicated in table 1. The thicknesses of the individual layers are illustrated correctly relative to one another in FIG. 3.

TABLE 1

| Reference symbol | Thickness [nm] | Material | Refractive index |
| --- | --- | --- | --- |
| 339 | Substrate | SiO$_2$ | 1.56 |
| 341 | 21.568 | LaF$_3$ | 1.69 |
| 343 | 67.626 | MgF$_2$ | 1.42 |
| 345 | 29.775 | LaF$_3$ | 1.69 |
| 347 | 42.969 | MgF$_2$ | 1.42 |
| 349 | 34.261 | LaF$_3$ | 1.69 |
| 351 | 26.823 | MgF$_2$ | 1.42 |

FIG. 4 shows an embodiment of an antireflection coating 437, in turn having six layers composed alternately of material having a high refractive index and material having a low refractive index. MgF$_2$ is used as material having a low refractive index, and LaF$_3$ is used as material having a high refractive index. The thicknesses of the individual layers, the materials and the refractive indices thereof and also the reference signs used in FIG. 4 are compiled in table 2.

TABLE 2

| Reference symbol | Thickness [nm] | Material | Refractive index |
| --- | --- | --- | --- |
| 439 | Substrate | SiO$_2$ | 1.56 |
| 441 | 13.762 | LaF$_3$ | 1.69 |
| 443 | 69.414 | MgF$_2$ | 1.42 |
| 445 | 42.945 | LaF$_3$ | 1.69 |
| 447 | 16.440 | MgF$_2$ | 1.42 |
| 449 | 40.914 | LaF$_3$ | 1.69 |
| 451 | 30.145 | MgF$_2$ | 1.42 |

FIG. 5 shows an exemplary embodiment of an antireflection coating 537, including seven layers composed alternately of material having a high refractive index and material having a low refractive index. MgF$_2$ is used as material having a low refractive index, and LaF$_3$ is used as material having a high refractive index. The thicknesses of the individual layers, the materials and the refractive indices thereof and also the reference signs used in FIG. 5 are compiled in table 3.

TABLE 3

| Reference symbol | Thickness [nm] | Material | Refractive index |
| --- | --- | --- | --- |
| 539 | Substrate | SiO$_2$ | 1.56 |
| 541 | 37.738 | MgF$_2$ | 1.42 |
| 543 | 15.378 | LaF$_3$ | 1.69 |
| 545 | 9.098 | MgF$_2$ | 1.42 |
| 547 | 29.126 | LaF$_3$ | 1.69 |
| 549 | 36.117 | MgF$_2$ | 1.42 |
| 551 | 29.917 | LaF$_3$ | 1.69 |
| 553 | 33.958 | MgF$_2$ | 1.42 |

Figure 6:
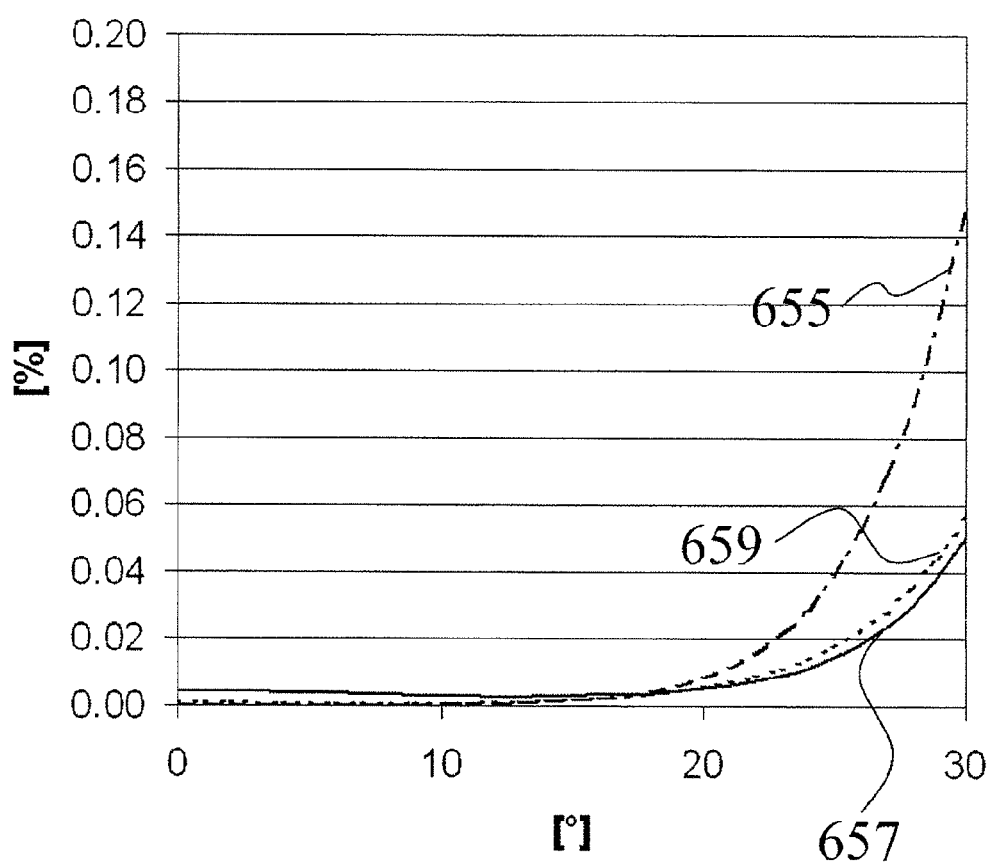
FIG. 6 shows a diagram with the reflectivity values of the antireflection coatings from FIGS. 3 to 5 as a function of the angles of incidence.

FIG. 6 shows, for the antireflection coatings 337, 437 and 537 illustrated in FIGS. 3 to 5, the reflectivity values in the unit [%] as a function of the angles of incidence in the unit [°]. The dash-dotted reflectivity curve 655 results for the antireflection coating 337 having the layer construction in accordance with table 1, the solid reflectivity curve 657 results for the antireflection coating 437 having the layer construction in accordance with table 2 and the dashed reflectivity curve 659 results for the antireflection coating 537 having the layer construction in accordance with table 3. In the case of all three antireflection coatings, the reflectivity curves 655, 657 and 659 for the angle of incidence range of 0° to 30° run below a reflectivity value of 0.2%, even below a reflectivity value of 0.1%. Up to an angle of incidence of 20°, the reflectivity curves 655, 657 and 659 run below a reflectivity value of 0.1%, even below a reflectivity value of 0.05%. In the case of the antireflection coatings 337 and 537, the reflectivity curves 655 and 659 for an angle of incidence range of 0° to 10° even run below a reflectivity value of 0.02%.

Figure 7:
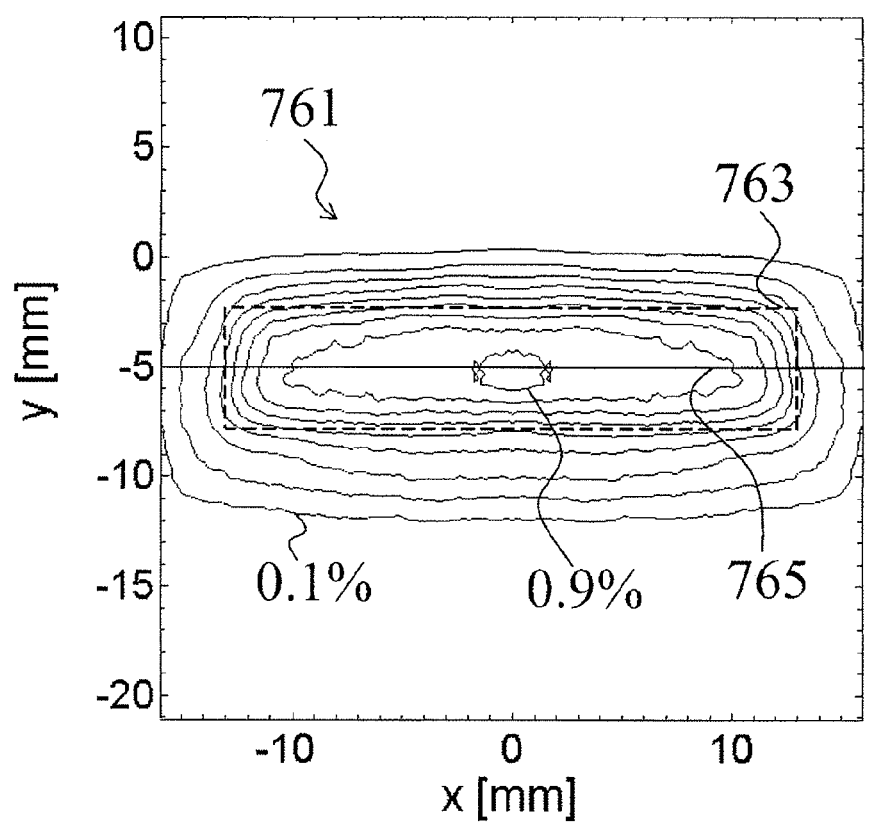
FIG. 7 shows a stray light intensity distribution as a contour line illustration for the pupil filling factor $\sigma=0.2$.

Using suitable ray tracing programs, for a given optical design of a projection objective, it is possible to calculate the intensity distribution of the stray light in the image plane taking account of the antireflection coatings. FIG. 7 shows for the projection objective 1 the intensity distribution 761 of the stray light in the image plane 9 in a contour line illustration. The contour lines are illustrated with a spacing of 0.1%. In this case, the stray light intensity relates to the homogeneous ambient brightness in the image field. In the simulation, the object field 3 was illuminated homogeneously with a pupil filling factor of σ=0.2. In this case, exclusively the single reflections at the lens surfaces of the lenses L21 and L22 that are passed through twice in the second partial objective 15 are taken into account as stray light. In this case, the lens surfaces are covered with an antireflection coating having a reflectivity of 0.2% for all angles of incidence. Antireflection coatings such as are used for reducing double reflections or higher-order reflections have this reflectivity value. A reflectivity of 0.2% is sufficient for avoiding double reflections since such a reflection, on account of the two reflections, has an intensity of just 0.2%·0.2%=0.0004%. The contour line illustration makes it clear, however, that such an antireflection coating does not effectively suppress the formation of disturbing single reflections. The single reflections completely illuminate the image field 763 which is depicted using dashed lines, and over the entire image field lead to a background illumination of at least 0.4%, in extensive regions even above 0.8%. The extent of the stray light in the image plane 9 (this extent being comparable with the extent of the image field 7) is caused by the fact that the stray light image of the object field 3 is situated more or less in the image plane 9, as becomes clear in FIG. 2 for the single reflection at the back surface of the lens L21.

Figure 8:
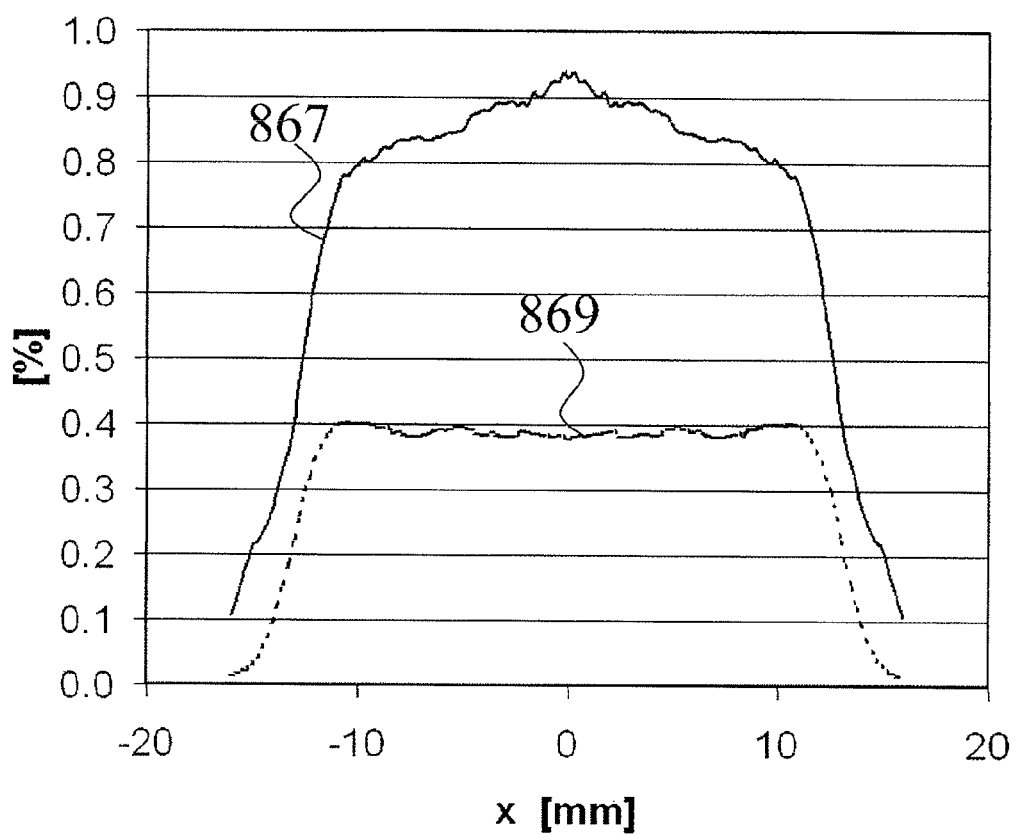
FIG. 8 shows stray light intensity profiles in the case of antireflection coating of the lenses that are passed through twice in the projection objective of FIG. 1 with a reflectivity of 0.2%.

FIG. 8 shows a section through the intensity distribution 761 along the line 765, running in the longitudinal direction of the image field 7 through the center of the image field 7, as intensity profile 867. The maximum stray light intensity is 0.93% in the image center and 0.41% at the image edge at x=±13 mm. The stray light simulation was carried out not only with an illumination with the pupil filling factor of σ=0.2 but also with a pupil filling factor of σ=1.0, that is to say with complete illumination of the entrance pupil of the projection objective. The section through the stray light intensity distribution for a pupil filling factor of σ=1.0 along the line 765 is illustrated in dashed fashion as intensity profile 869 in FIG. 8. With complete illumination of the entrance pupil of the projection objective, the maximum stray light intensity is 0.40%. Within the image field 7, the stray light intensity has a virtually constant value. It is evident that the stray light intensity is greatly dependent on the pupil filling factor. Thus, the maximum stray light intensity within the image field 7 for a pupil filling factor of σ=1.0 is lower by 0.523% than that for a pupil filling factor of σ=0.2. This is characteristic of stray light caused by single reflections. Although stray light on account of surface or a volume scattering likewise leads to a background illumination in the entire image field, the intensity distribution thereof is virtually independent of the pupil filling factor in the image plane in comparison with single reflections. If the measured stray light, as in the present case, has a great dependence on the pupil filling factor, then this is an indication of the formation of single reflections.

Figure 9:
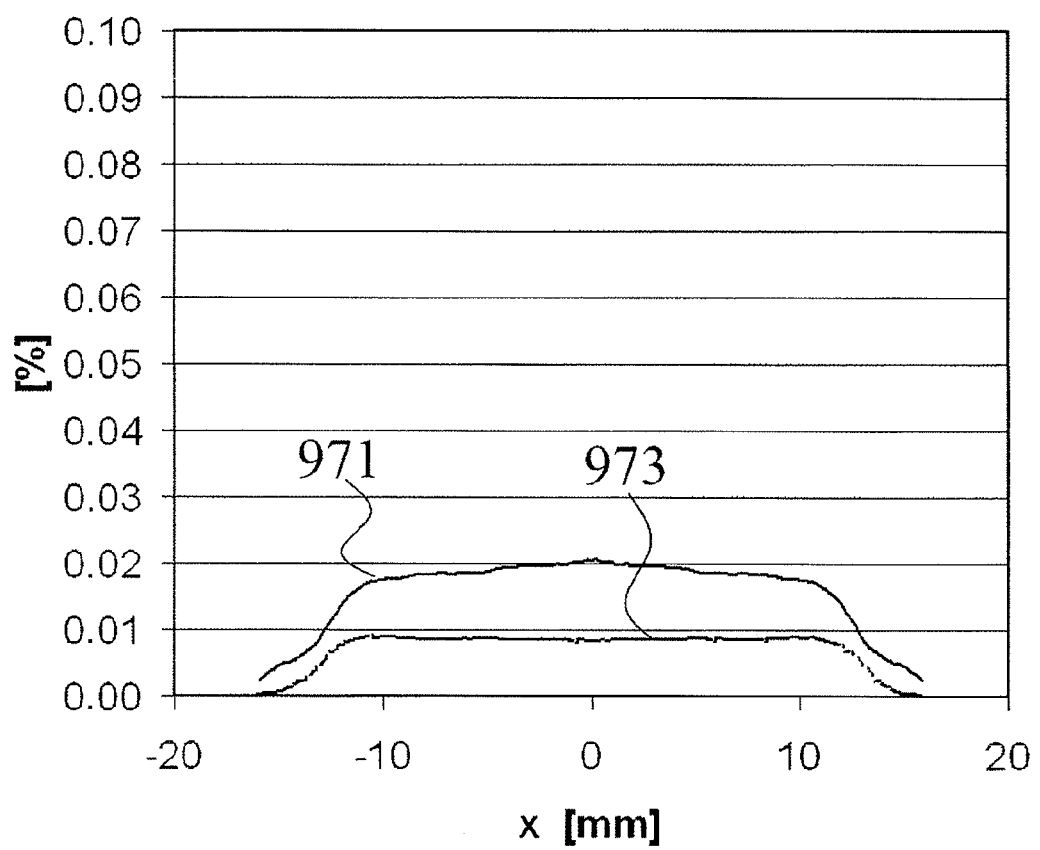
FIG. 9 shows stray light intensity profiles in the case of an antireflection coating in accordance with FIG. 4 of the lenses that are passed through twice in the projection objective of FIG. 1.

FIG. 9 shows the intensity profile 971 for a pupil filling factor of σ=0.2 and the intensity profile 973 for the pupil filling factor of σ=1.0 as sections through stray light intensity distributions, which arise if the lens surfaces of the second partial objective are covered with the antireflection coating 437, the layer construction of which is indicated in table 2. With the improved antireflection coating the maximum stray light intensity within the image field 7 decreases from 0.93% to 0.02% for the pupil filling factor of σ=0.2, and from 0.40% to 0.01% for the pupil filling factor of σ=1.0. It should be taken into consideration that in FIG. 9 the scale of the intensity axis is reduced by a factor of 10 in comparison with the scale in FIG. 8. For the improved antireflection coating the maximum variation of the stray light between the two pupil filling factors is just 0.01% and is therefore vanishingly small. The single reflections can thus be effectively suppressed with the improved antireflection coating 437. By therefore measuring the stray light intensity once for the pupil filling factor of σ=0.2 and once for the pupil filling factor of σ=1.0 within the image field 7, it is possible to determine the influence of the single reflections of the lenses that are passed through twice in the second partial objective 15 independently of further contributions to the stray light which have other causes and are not dependent on the pupil factor chosen.

Figure 10:
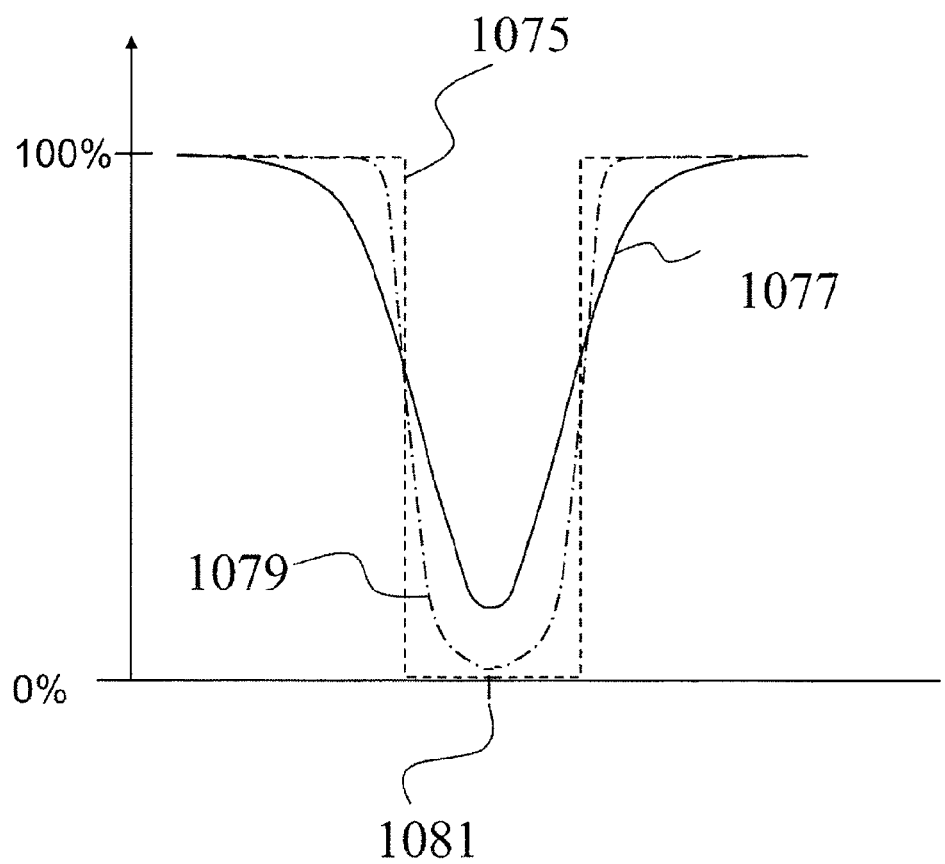
FIG. 10 shows a schematic illustration for illustrating the stray light measurement technique.

In order to measure the stray light in the image plane, the so-called Kirk test is employed, for example, which is described in US2009/0086179A1, inter alia. In the Kirk test, a square object which has a predetermined edge length, for example, 1.0 mm and is itself not luminous is arranged within the object field 3. The object used is a small box, for example, which completely absorbs the illumination light and therefore can be regarded as "black". By contrast, the surroundings of the small box are homogeneously illuminated by the illumination light. The small box is imaged into the image plane 9 by the projection objective 1. In the case of ideal imaging and disregarding stray light, a square, unilluminated region would arise in the image plane 9. FIG. 10 shows in schematic illustration, a section through the intensity profile in the region of the image of the small box. In the case of ideal imaging and disregarding the stray light, the intensity curve 1075, depicted by a dashed line, arises, which falls abruptly from 100% to 0% in the region of the image of the small box. The stray light has the effect, however, that it is not dark in the center 1081 of the image of the small box, rather a stray light intensity can be detected. The intensity curve 1077, illustrated by a solid line, illustrates the intensity profile which arises upon taking account of the single reflections at the lens surfaces of the second partial objective 15. Stray light on account of surface or volume scattering leads to the intensity profile 1079 illustrated in dash-dotted fashion, which leads to a significantly lower stray light intensity in the center of the image of the small box given a sufficient edge length of the small box. By virtue of the edge length of the small box being 1.0 mm, during the measurement of the stray light it is possible to distinguish the contribution of the lens surfaces of the second partial objective 15 from other stray light contributions. In this case, the intensity value in the center 1081 of the image of the small box corresponds to the integrated stray light intensity which results from stray light sources arranged outside the small box.

For a pupil filling factor of σ=0.2 and for a small box having the edge length of 1.0 mm, an intensity of 1.1% arises in the center of the image of the small box if all the lens surfaces of the partial objective 15 are covered with an anti-reflection coating having a reflectivity of 0.2% for all angles of incidence. If, by contrast, the lens surfaces of the lenses L21 and L22 are covered with the antireflection coating 437 indicated in table 2, then the stray light intensity in the center of the image of the small box decreases to 0.3%. The measurement of the stray light according to the Kirk test using a square small box having an edge length of between 0.8 mm and 1.2 mm thus makes it possible to directly determine the stray light proportion owing to single reflections.

Figure 11:
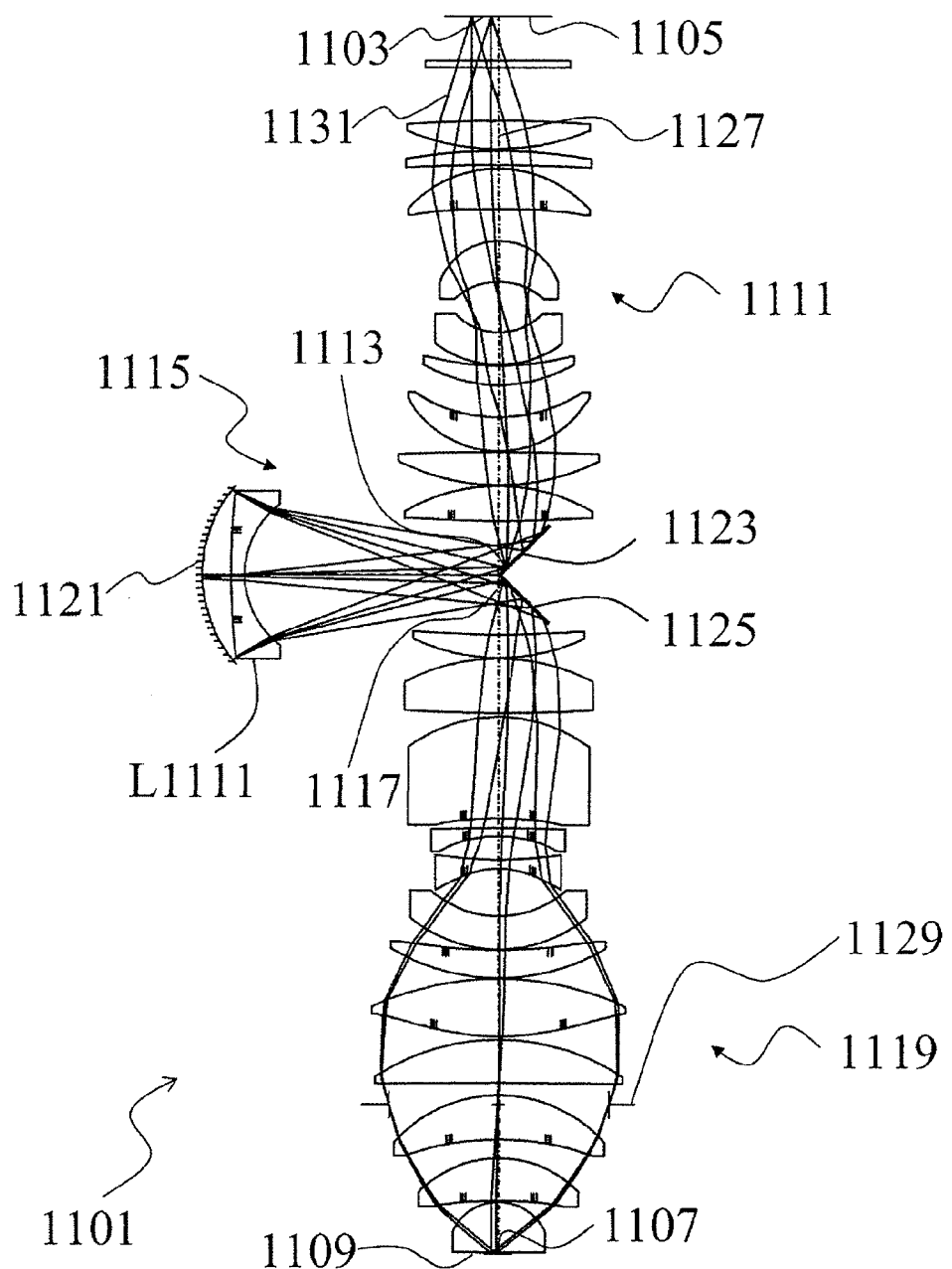
FIG. 11 shows the lens section of a catadioptric projection objective together with the projection light beam path.

FIG. 11 shows a lens section of a catadioptric projection objective 1101. The elements in FIG. 11, which correspond to the elements from FIG. 1, have the same reference signs as in FIG. 1 increased by the number 1100; for a description of these elements, reference is made to the description concerning FIG. 1.

The optical data for the projection objective 1101 are compiled in table 4. The aspherical surfaces can be described by the following sagitta formula:

$$p(h) = \frac{\frac{1}{R}h^2}{1+\sqrt{1-(1+K)\left(\frac{1}{R}\right)^2 h^2}} + \sum_{k=1}^{\infty} C_k h^{2k+2}$$

In this case, p represents the axial distance in [mm] of the aspherical surface from a plane—perpendicular to the optical axis—through the vertex of the aspherical surface in the case of radial distance h in [mm], R represents the vertex radius in [mm], K represents the conical constant, and Ck represents the individual aspherical constants of the order k in $$\left[\frac{1}{mm^{2k+2}}\right].$$

The projection objective 1101 has a numerical aperture of NA=1.2 in the image plane 1109. The operating wavelength is 193.306 nm. The image field 1107 amounts to 26.0 mm×5.5 mm and has a minimum distance from the optical axis 1127 of 1.98 mm. The projection objective 1101 has an absolute value of the imaging scale of 0.25. This present embodiment involves an immersion projection objective, in which during operation water as immersion liquid is situated between the last lens surface and the object to be exposed.

The first partial objective 1111 is formed by the surfaces 1 to 20, the second partial objective 1115 is formed by the surfaces 22 to 26 and the third partial objective 1119 is formed by the surfaces 28 to 52. The folding mirrors 1123 and 1125 with the surface numbers 21 and 27 are not assigned to any of the three partial objectives 1111, 1115 and 1119, since the folding mirrors 1123 and 1125, as plane mirrors have no influence on the imaging, but rather only deflect the projection light 1131. The first partial objective 1111 has an absolute value of the imaging scale of 1.05, the second partial objective 1115 has an absolute value of the imaging scale of 1.01 and the third partial objective 1119 has an absolute value of the imaging scale of 0.23.

All the principal rays which emerge from the object field 1103 and which intersect the optical axis 1127 at the location of the aperture diaphragm 1129 have at the concave mirror 1121 a height which is less than 9.1% of the diameter of the optically utilized region of the concave mirror 1121. The concave mirror 1121 is thus arranged in the region of a pupil plane of the projection objective 1101.

The principal ray emerging from the object point (x=52.00 mm, y=29.93 mm) has a radial distance from the optical axis of 70 mm in a fictitious plane which is perpendicular to the optical axis 1127 and which intersects the optical axis 1127 at the same location as the second folding mirror 1125. The fictitious marginal ray has, by contrast, nearly a radial distance of 1.5 mm in this plane. In this case, the object point (x=52.00 mm, y=29.93 mm) has the largest distance from the optical axis 1127 within the object field 1103. The second intermediate image 1117 is thus arranged in the region of the second folding mirror 1125.

The sequence of the lens surfaces in table 4 corresponds to the projection light path. The projection light passes through all the surfaces in the order indicated. The lens L1111 of the second partial objective 1115 is passed through twice and is therefore indicated twice with the surface numbers 22 and 23, and 26 and 25, in table 4. In this case, the lens L1111 is the sole lens in the second partial objective 1115. The distance between the lens L1111 and the concave mirror 1121 is 40.2 mm. The first paraxial intermediate image has a distance of 312.12 mm from the concave mirror 1121, the second paraxial intermediate image has a distance of 316.25 mm from the concave mirror 1121. The lens L1111 is therefore arranged nearer to the concave mirror 1121 than to the first intermediate image 1113 or to the second intermediate image 1117.

In principle, the lens L1111, owing to its arrangement in the second partial objective as a lens that is passed through twice, would be critical for the production of a single reflection in the image plane 1109. However, that lens surface of the lens L1111 which faces the concave mirror 1121, that is to say the back surface of the lens L1111, has a marginal ray concentricity of 30.0°, and the front surface has a marginal ray concentricity of 30.8°. Both surfaces thus deviate considerably from the marginal ray concentricity. At the same time, the extent of the second folding mirror 1125 is adapted to the extent of the projection light beam 1131. Thus, the extent of the projection light beam on the second folding mirror 1125 is 141.1 mm×65.4 mm, while the second folding mirror 1125 has an extent of 145 mm×70 mm. The formation of a single reflection is largely suppressed on account of the deviation of the two lens surfaces of the lens L1111 from the marginal ray concentricity and the second folding mirror 1125 adapted to the extent of the projection light beam.

Figure 12:
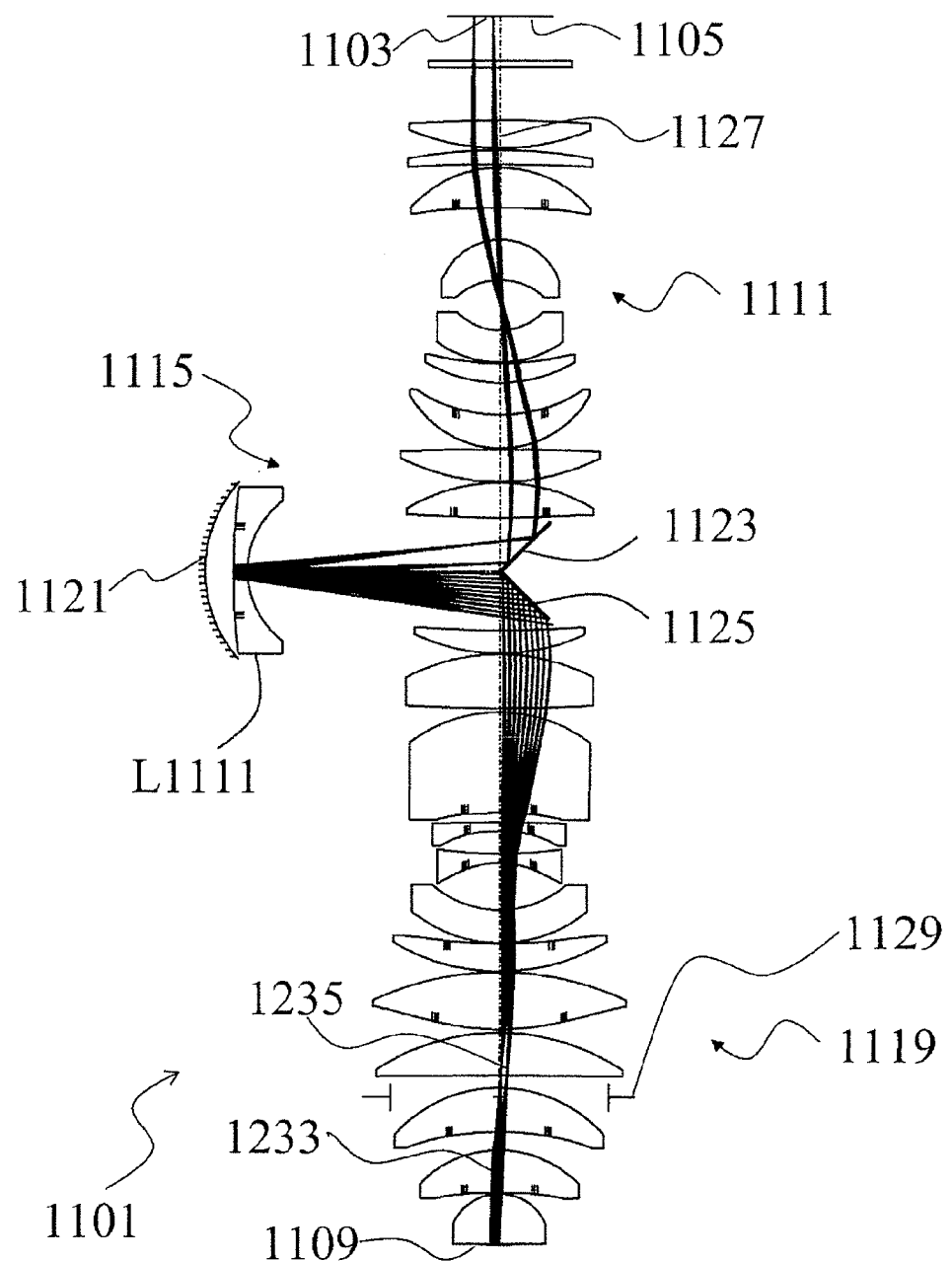
FIG. 12 shows the lens section of the projection objective of FIG. 11 with a stray light path.

FIG. 12 shows, for the exemplary embodiment from FIG. 11, the stray light path 1233, formed if the projection light 1131 is reflected at the back surface of the lens L1111. It becomes clear from the stray light path 1233 that the stray light intermediate image 1235 is not formed on the second folding mirror 1125, but rather far away from the folding mirror 1125 in the vicinity of the aperture stop plane with the aperture stop 1129. The stray light beam at the second folding mirror 1125 thus has a much larger extent than the second folding mirror 1125 and is largely vignetted. Consequently, the stray light beam in the object plane 1105 has only a small aperture in comparison with the maximum possible aperture. In addition, this stray light is greatly focused in the region of the aperture stop 1129, such that it could be shaded by a diaphragm around the optical axis.

Figure 13:
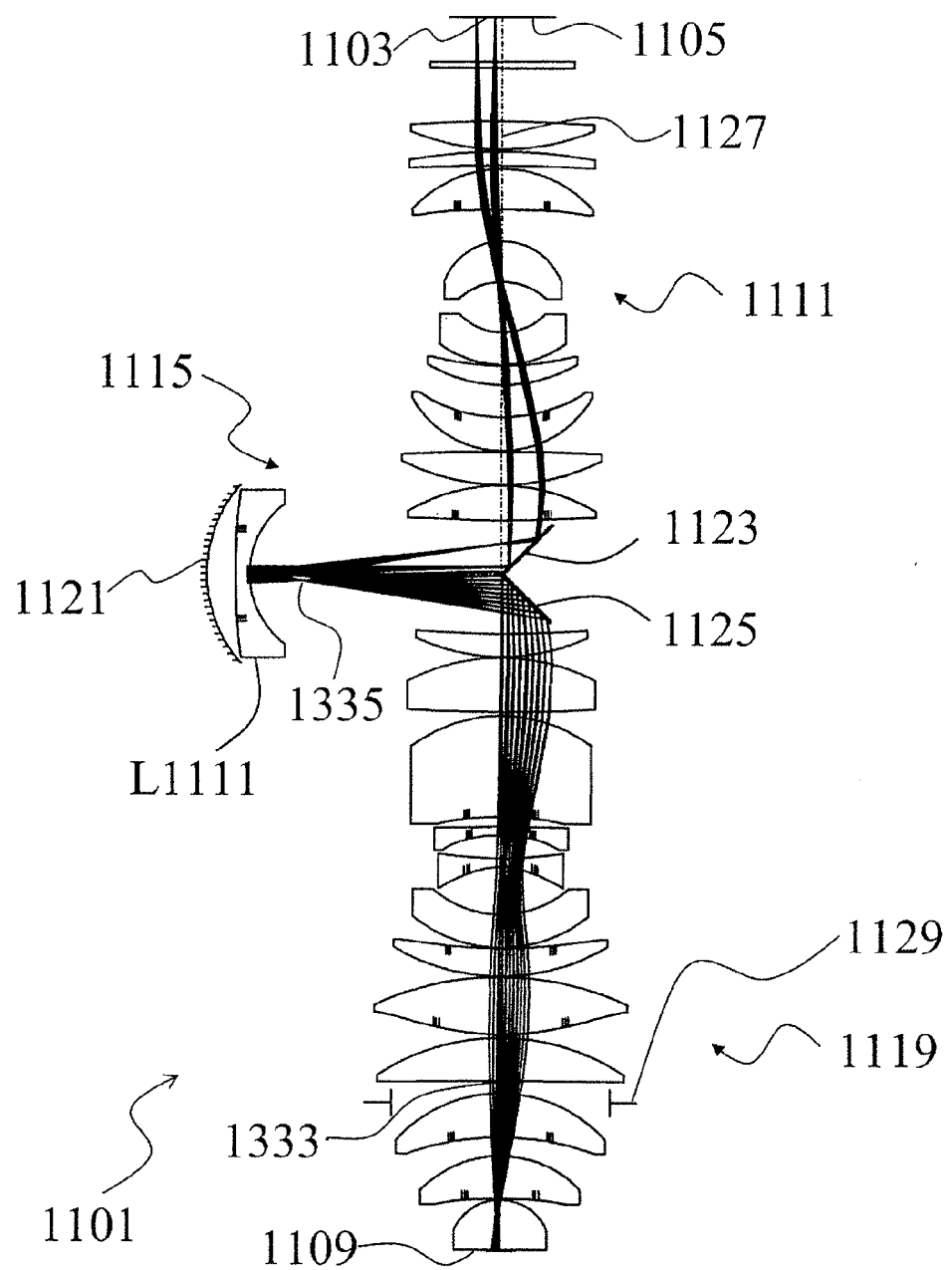
FIG. 13 shows the lens section of the projection objective of FIG. 11 with a stray light path.

FIG. 13 shows, for the exemplary embodiment from FIG. 11, the stray light path 1333 formed if the projection light 1131 is reflected at the front surface of the lens L1111. In this case, the stray light intermediate image 1335 is formed shortly after the lens L1111 and thus likewise far away from the folding mirror 1125 such that the stray light beam at the second folding mirror 1125 has a much larger extent than the second folding mirror 1125 and is largely vignetted.

By virtue of the front and back surfaces of the lens L1111 deviating more than 20° from the marginal ray concentricity, the formation of a single reflection in the image plane 1109 can be largely suppressed.

Figure 14:
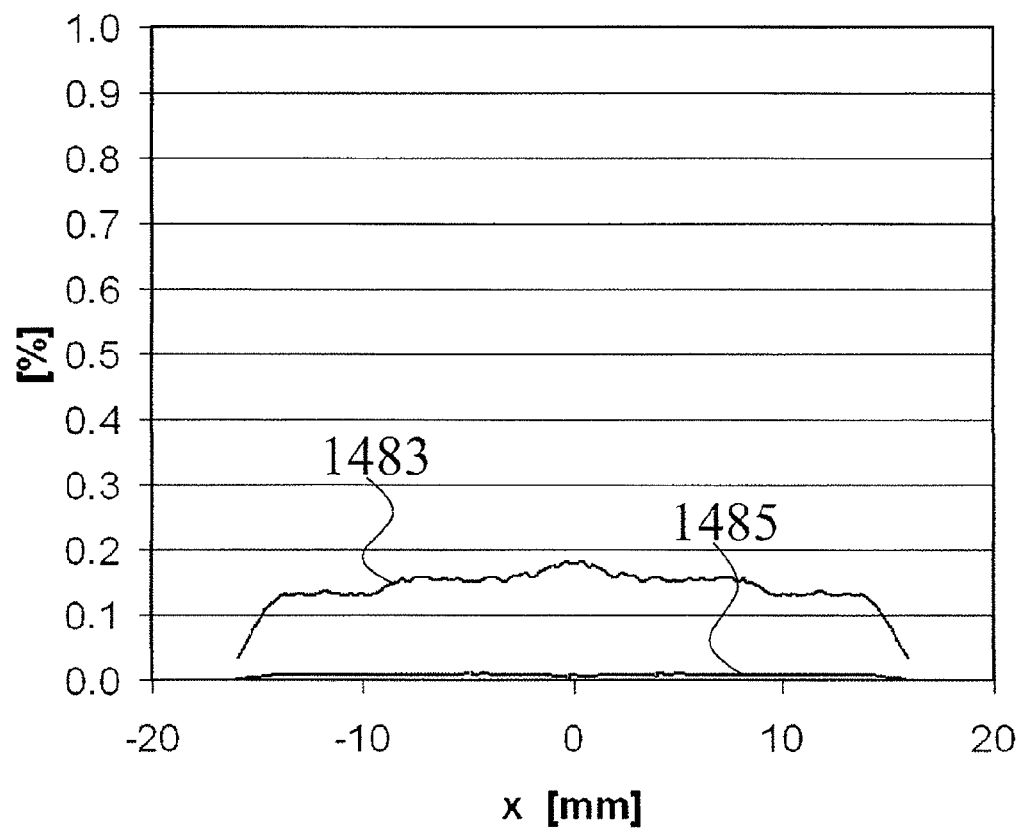
FIG. 14 shows stray light intensity profiles in the case of antireflection coating of the lenses that are passed through twice in the projection objective of FIG. 11 with a reflectivity of 0.2%.

In order to show the reduction of the single reflections by the specific configuration of the lens surfaces of the second partial objective 1115, stray light simulations were carried out for the projection objective 1101 and the stray light intensity distributions in the image plane 1109 were determined. In the simulation, the object field 1103 was homogeneously illuminated firstly with a pupil filling factor of σ=0.2 and secondly with a pupil filling factor of σ=1.0. In this case, exclusively the single reflections at the lens surfaces of the lens L1111 that is passed through twice in the second partial objective 1115 are taken into account as stray light. In this case, the lens surfaces are covered with an antireflection coating having a reflectivity of 0.2% for all angles of incidence. FIG. 14 shows, with the intensity profile 1483, a section through the stray light intensity distribution for the pupil filling factor of σ=0.2 along a line running in the longitudinal direction of the image field 1107 through the center of the image field 1107. The maximum stray light intensity is 0.18% in the image center and 0.13% at the image edge at x=±13 mm. The section through the stray light intensity distribution for a pupil filling factor of σ=1.0 is illustrated as intensity profile 1485 in FIG. 14. The maximum stray light intensity is just 0.01% with complete illumination of the entrance pupil of the projection objective. Although a dependence of the stray light on the pupil filling factor is still evident, the variation between a pupil filling factor of σ=1.0 and a pupil filling factor of σ=0.2 is only 0.17%.

Figure 15:
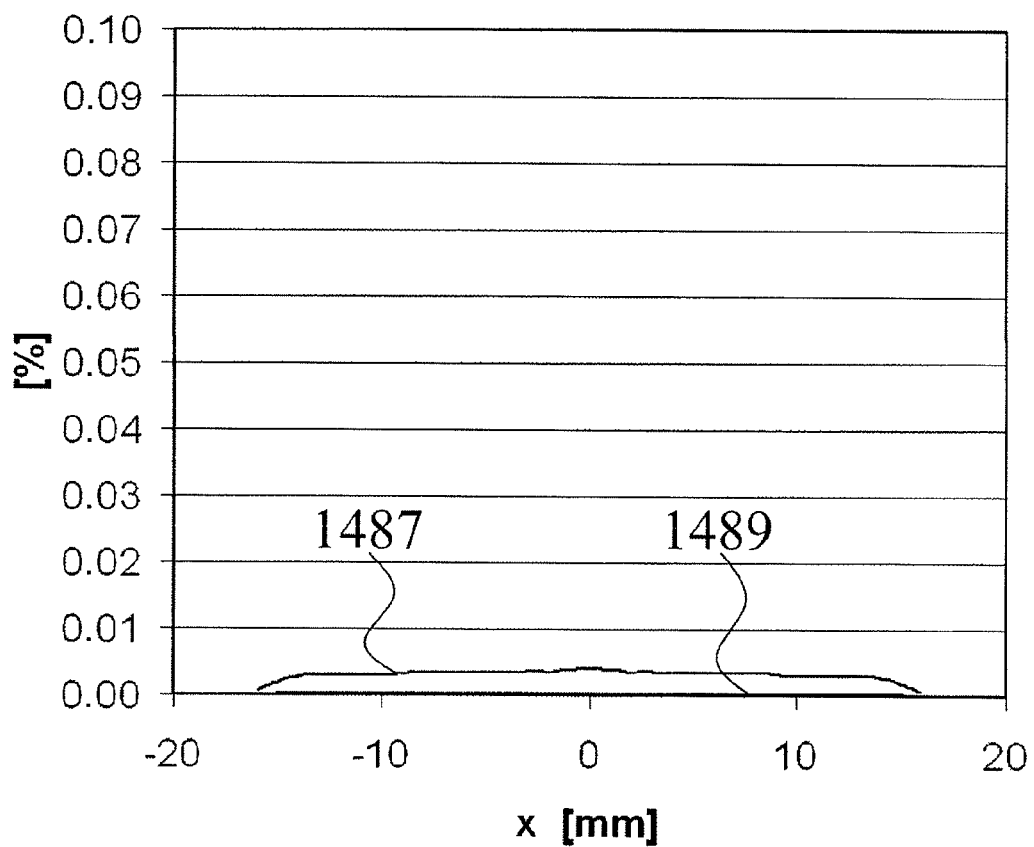
FIG. 15 shows stray light intensity profiles in the case of an antireflection coating in accordance with FIG. 4 of the lenses that are passed through twice in the projection objective from FIG. 11.

FIG. 15 shows the intensity profile 1487 for a pupil filling factor of σ=0.2 and the intensity profile 1489 for the pupil filling factor of σ=1.0 as sections through stray light intensity distributions, which arise if the lens surfaces of the second partial objective are covered with the antireflection coating 437, the layer construction of which is indicated in table 2. With the improved antireflection coating, the maximum stray light intensity within the image field 1107 decreases from 0.18% to 0.004% for the pupil filling factor of σ=0.2 and from 0.01% to 0.002% for the pupil filling factor of σ=1.0. It should be taken into consideration that in FIG. 15 the scale of the intensity axis has once again been reduced by a factor of 10 in comparison with the scale in FIG. 14. Consequently, the single reflection is practically no longer detectable.

If the Kirk test is employed using a square small box having an edge length of 1.0 mm, an intensity of 0.4% results for a pupil filling factor of σ=0.2 in the center of the image of the small box if all the lens surfaces of the partial objective 1115 are covered with an antireflection coating having a reflectivity of 0.2% for all angles of incidence. If, by contrast, the lens surfaces of the lens L1111 are covered with the antireflection coating 437 indicated in table 2, then the stray light intensity in the center of the image of the small box decreases to 0.3%.

Figure 16:
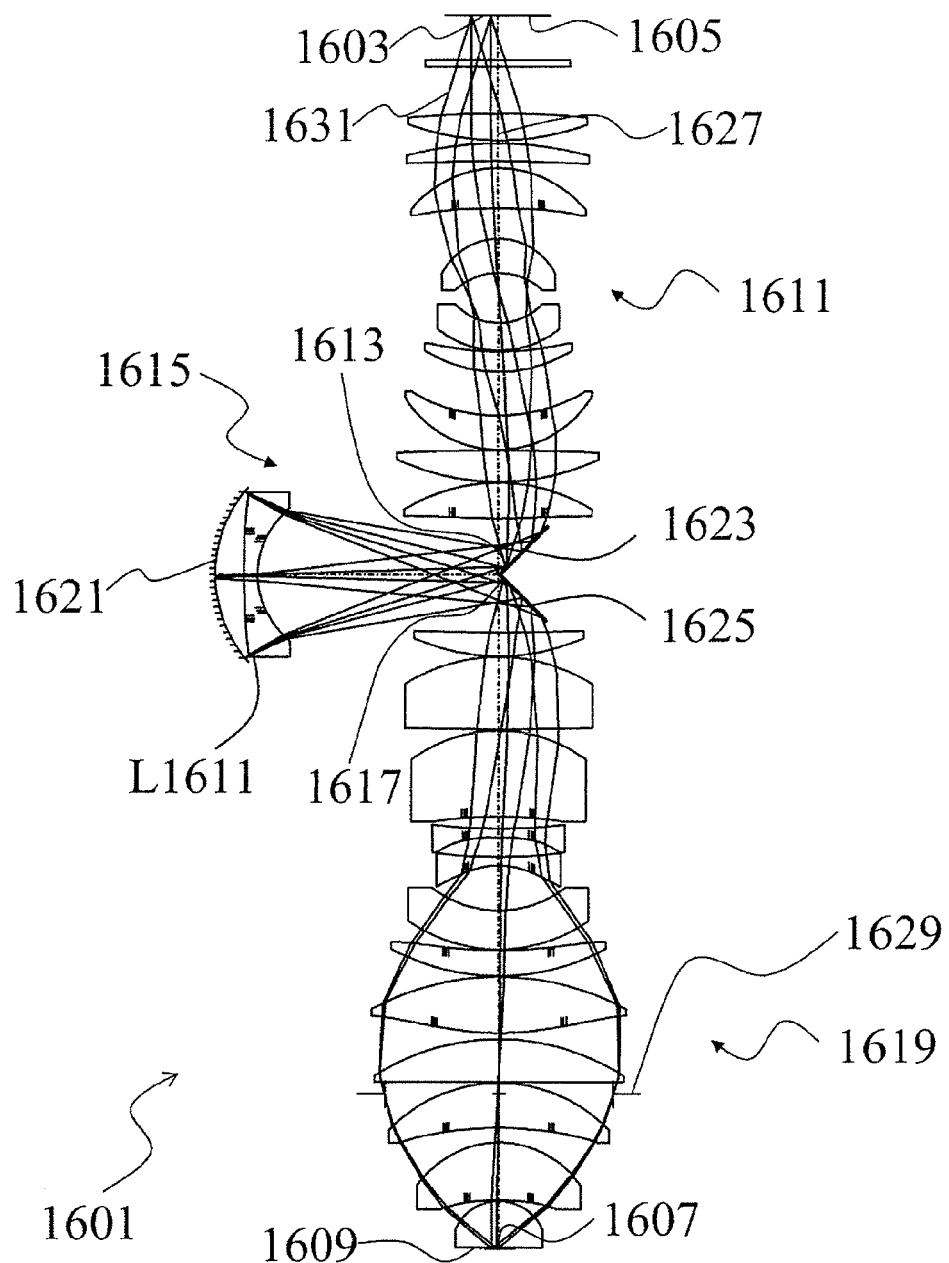
FIG. 16 shows the lens section of a catadioptric projection objective together with the projection light beam path.

FIG. 16 shows a lens section of a catadioptric projection objective 1601. The elements in FIG. 16 which correspond to the elements from FIG. 1 have the same reference signs as in FIG. 1 increased by the number 1600; for a description of these elements reference is made to the description of FIG. 1.

The optical data for the projection objective 1601 are compiled in table 5. The projection objective 1601 has a numerical aperture of NA=1.2 in the image plane 1609. The operating wavelength is 193.306 nm. The image field 1607 is 26 mm×5.5 mm and has a minimum distance from the optical axis 1627 of 1.98 mm. The projection objective 1601 has an absolute value of the imaging scale of 0.25. The present embodiment again involves an immersion projection objective, in which during the operation water as immersion liquid is situated between the last lens surface and the object to be exposed.

The first partial objective 1611 is formed by the surfaces 1 to 20, the second partial objective 1615 is formed by the surfaces 22 to 26 and the third partial objective 1619 is formed by the surfaces 28 to 52. The first partial objective 1611 has an absolute value of the imaging scale of 1.03, the second partial objective 1615 has an absolute value of the imaging scale of 1.01 and the third partial objective 1619 has an absolute value of the imaging scale of 0.24.

All the principal rays which emerge from the object field 1603 and which intersect the optical axis 1627 at the location of the aperture diaphragm 1629 have at the concave mirror 1621, a height which is less than 8.6% of the diameter of the optically utilized region of the concave mirror 1621. The concave mirror 1621 is thus arranged in the region of a pupil plane of the projection objective 1601.

The principal ray emerging from the object point (x=52 mm, y=29.93 mm) has a radial distance of 68.29 mm in a fictitious plane which is perpendicular to the axis 1627 and which intersects the optical axis 1627 at the same location as the second folding mirror 1625. By contrast, the fictitious marginal ray has only a radial distance of 0.82 mm in this plane. In this case, the object point (x=52 mm, y=29.93 mm) has the largest distance from the optical axis 1627 within the object field 1603. The second intermediate image 1617 is thus arranged in the region of the second folding mirror 1625.

The lens L1611 is the sole lens in the second partial objective 1615. Both the front surface and the back surface of the lens L1611 are configured as aspherical surfaces. The distance between the lens L1611 and the concave mirror 1621 is 40.2 mm. The first paraxial intermediate image has a distance of 300.48 mm from the concave mirror 1621, the second paraxial intermediate image has a distance of 316.25 mm from the concave mirror 1621. The lens L1611 is thus arranged nearer to the concave mirror 1621 than to the first intermediate image 1613 or to the second intermediate image 1617.

That lens surface of the lens L1611 which faces the concave mirror 1621, that is to say the back surface of the lens L1611, has a marginal ray concentricity of 30.9°, and the front surface has a marginal ray concentricity of 30.2°. Both surfaces thus deviate considerably from the marginal ray concentricity.

Figure 17:
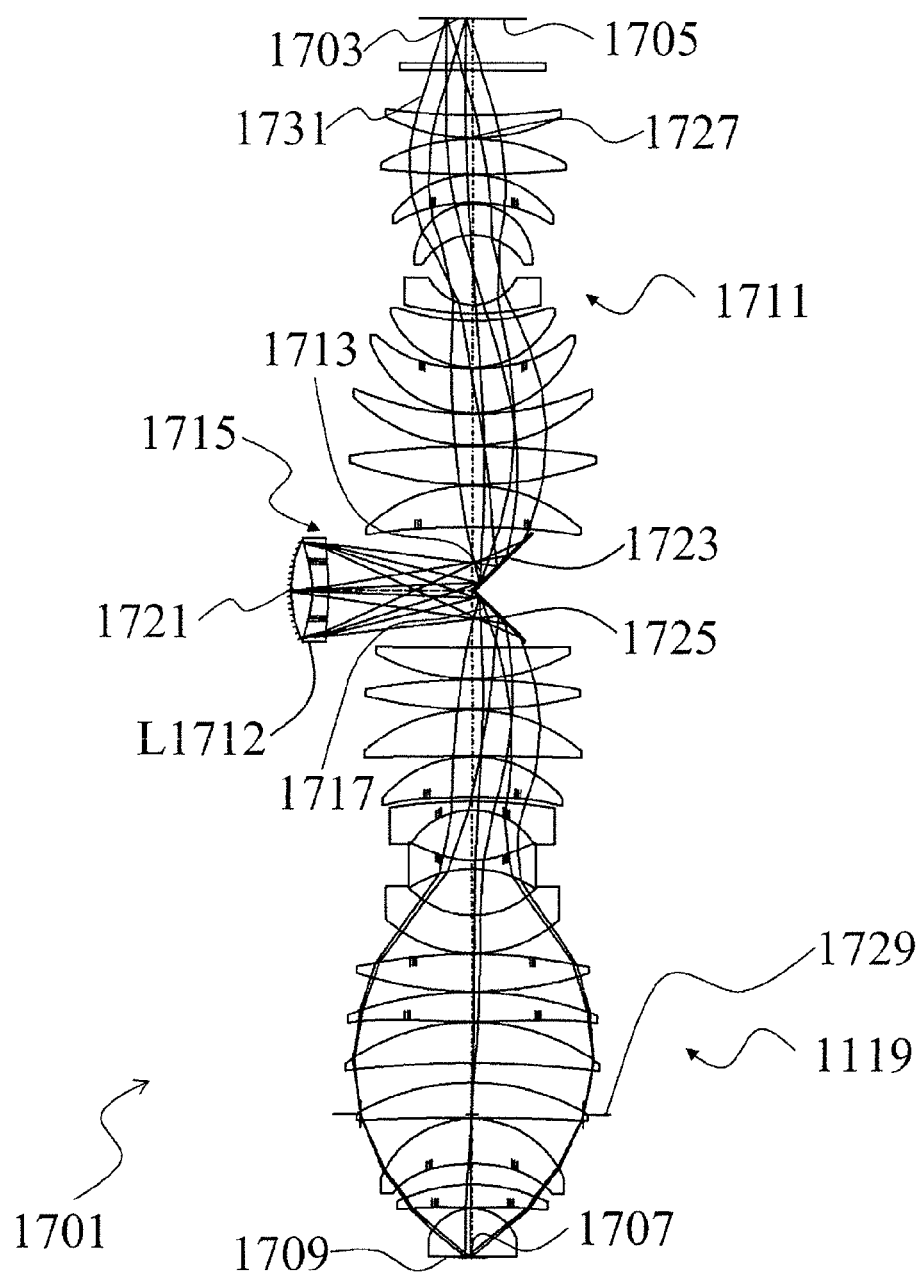
FIG. 17 shows the lens section of a catadioptric projection objective together with the projection light beam path.

FIG. 17 shows a lens section of a catadioptric projection objective 1701. The elements in FIG. 17 which correspond to the elements from FIG. 1 have the same reference signs as in FIG. 1 increased by the number 1700; for a description of these elements reference is made to the description of FIG. 1, above.

The optical data for the projection objective 1701 are compiled in table 6. The projection objective 1701 has a numerical aperture of NA=1.2 in the image plane 1709. The operating wavelength is 193.307 nm. The image field 1707 is 26.0 mm×5.5 mm and has a minimum distance from the optical axis 1727 of 1.98 mm. The projection objective 1701 has an absolute value of the imaging scale of 0.25. The present embodiment is again an immersion projection objective, in which during the operation water as immersion liquid is situated between the last lens surface and the object to be exposed.

The first partial objective 1711 is formed by the surfaces 1 to 22, the second partial objective 1715 is formed by the surfaces 24 to 28 and the third partial objective 1719 is formed by the surfaces 30 to 58. The first partial objective 1711 has an absolute value of the imaging scale of 0.96, the second partial objective 1715 has an absolute value of the imaging scale of 1.00 and the third partial objective 1719 has an absolute value of the imaging scale of 0.26.

All the principal rays which emerge from the object field 1703 and which intersect the optical axis 1727 at the location of the aperture diaphragm 1729 have at the concave mirror 1721, a height which is less than 7.5% of the diameter of the optically utilized region of the concave mirror 1721. The concave mirror 1721 is thus arranged in the region of a pupil plane of the projection objective 1701.

The principal ray emerging from the object point (x=52 mm, y=29.93 mm) has a radial distance of 67.77 mm in a fictitious plane which is perpendicular to the axis 1727 and which intersects the optical axis 1727 at the same location as the second folding mirror 1725. By contrast, the fictitious marginal ray has only a radial distance of 1.27 mm in this plane. In this case, the object point (x=52 mm, y=29.93 mm) has the largest distance from the optical axis 1727 within the object field 1703. The second intermediate image 1717 is thus arranged in the region of the second folding mirror 1725.

The lens L1712 is the sole lens in the second partial objective 1715. Both the front surface and the back surface of the lens L1712 are configured as aspherical surfaces. The distance between the lens L1712 and the concave mirror 1721 is 33.4 mm. The first paraxial intermediate image has a distance of 188.92 mm from the concave mirror 1721, the second paraxial intermediate image has a distance of 189.59 mm from the concave mirror 1721. The lens L1712 is thus arranged nearer to the concave mirror 1721 than to the first intermediate image 1713 or to the second intermediate image 1717.

That lens surface of the lens L1712 which faces the concave mirror 1721, that is to say the back surface of the lens L1712, has a marginal ray concentricity of 38.6°, and the front surface has a marginal ray concentricity of 20.0°. Both surfaces thus deviate from the marginal ray concentricity. In comparison with the lenses L1111 in the projection objectives 1101 and L1611 in the projection objective 1601, the lens bending of the lens L1712 is opposite to that of the lenses L1111 or L1611. While in the case of the front surfaces of the lenses L1111 or L1611 the surface normal at the intersection point of the fictitious marginal ray run between marginal ray and optical axis 1127 and 1627, respectively, in the case of the front surface of the lens L1712 the fictitious marginal ray runs between surface normal at the intersection point of the marginal ray and the optical axis 1727. Consequently, the front surface of the lens L1712 is convexly curved with respect to the marginal ray incident from the first intermediate image 1713.

Figure 18:
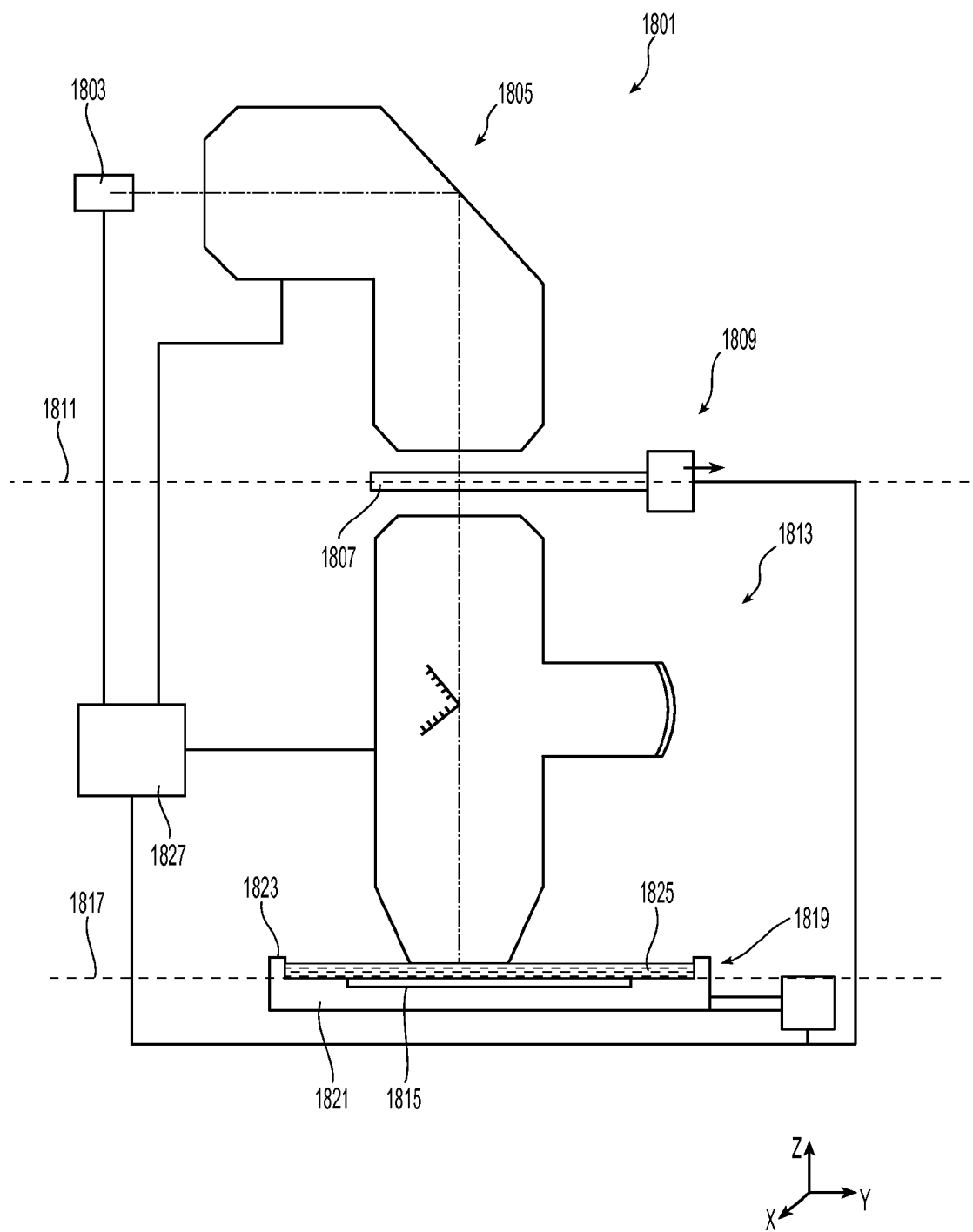
FIG. 18 shows a schematic illustration of a microlithography projection exposure apparatus.

FIG. 18 schematically shows a projection exposure apparatus 1801 for microlithography that serves for producing semiconductor components or other finely structured components. The projection exposure apparatus 1801 has an excimer laser 1803 as light source having an operating wavelength of 193 nm, although other excimer lasers for example having operating wavelengths of 157 nm or 248 nm are also possible. An illumination system 1805, disposed downstream of the laser, generates a sharply bounded, homogeneously illuminated illumination field that is simultaneously adapted with regard to its angular distribution to the requirements of the projection objective 1813, disposed downstream of the illumination system. The illumination system 1805 has devices for selecting the illumination mode and can thereby generate for example in the exit pupil of the illumination system 1805, or in the entrance pupil of the projection objective 1813, a conventional illumination with a variable pupil filling factor σ, an annular illumination, dipole illumination or quadrupole illumination.

A device 1809 for holding and manipulating a reticle 1807 is arranged in the light direction downstream of the illumination system 1805. The reticle 1807, also referred to as a mask, has the structure to be imaged. The device 1809 is used to move the reticle 1807 in a scanning direction for scanning purposes in the object plane 1811.

The projection objective 1813 is a catadioptric projection objective, as described with reference to FIGS. 1, 11, 16 and 17. The catadioptric projection objective 1813 images that part of the reticle 1807 which is illuminated by the illumination system 1805 onto the wafer 1815 in demagnified fashion. The wafer 1815 has a light-sensitive layer that is exposed upon irradiation with the projection light.

The wafer 1815 is held by a device 1819 that permits a corresponding movement of the wafer 1815 synchronized with the scanning movement of the reticle. The device 1819 also has manipulators that position the wafer 1815 optimally in the image plane 1817 of the projection objective 1813. The device 1819 is designed for the immersion use of the projection objective. It has a holding unit 1821 having a shallow depression or recess for holding the wafer 1815. The holding unit 1821 has a peripheral edge 1823 in order to prevent the immersion medium 1825 from flowing away.

The projection exposure apparatus is controlled by a central computer unit 1827.

In order to produce semiconductor components and other finely structured components with the projection exposure apparatus 1801, therefore, provision is made of a reticle 1807 having a predetermined pattern in the object plane 1811 of the catadioptric projection objective 1813, provision is made of a wafer 1815 having a light-sensitive layer in the image plane of the catadioptric projection objective 1813, the reticle 1807 is illuminated with the illumination system 1805 and, finally, the illuminated region of the reticle 1807 is imaged onto the wafer 1815 by the catadioptric projection objective 1813.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

TABLE 4

NA 1.2
Object height 60
Wavelength 193.306

| Surface | Radius | Thickness | Material | Refractive index | Half diameter |
| --- | --- | --- | --- | --- | --- |
| 0 | 0.000000 | 50.000000 | | | 60.0 |
| 1 | 0.000000 | 8.000000 | SiO2 | 1.560326 | 75.8 |
| 2 | 0.000000 | 59.610620 | | | 77.4 |
| 3 | 1439.380884 | 32.013517 | SiO2 | 1.560326 | 97.3 |
| 4 | −271.207483 | 2.110453 | | | 99.0 |
| 5 | 583.614042 | 16.197420 | SiO2 | 1.560326 | 100.5 |
| 6 | 1991.428343 | 3.396948 | | | 100.2 |
| 7 | 137.148931 | 46.192632 | SiO2 | 1.560326 | 99.4 |
| 8 | 1990.872673 | 35.955682 | | | 95.9 |
| 9 | 71.140440 | 46.083036 | SiO2 | 1.560326 | 64.8 |
| 10 | 74.802466 | 57.285100 | | | 47.1 |
| 11 | −67.442491 | 36.623983 | SiO2 | 1.560326 | 45.5 |
| 12 | −120.009774 | 0.999896 | | | 67.8 |
| 13 | −316.440706 | 21.841425 | SiO2 | 1.560326 | 76.2 |
| 14 | −166.255801 | 36.560578 | | | 81.2 |
| 15 | −182.509454 | 38.166255 | SiO2 | 1.560326 | 94.7 |
| 16 | −116.928613 | 0.999888 | | | 100.2 |
| 17 | 2344.762362 | 37.265639 | SiO2 | 1.560326 | 108.4 |
| 18 | −253.120036 | 0.999878 | | | 109.2 |
| 19 | 208.087128 | 40.064181 | SiO2 | 1.560326 | 102.3 |
| 20 | −744.545556 | 61.091342 | | | 99.6 |
| 21 | 0.000000 | −287.184726 | Mirror | | 70.8 |
| 22 | 100.735080 | −15.000002 | SiO2 | 1.560326 | 77.3 |
| 23 | 1546.908367 | −32.735719 | | | 95.3 |
| 24 | 154.868408 | 32.735719 | Mirror | | 97.4 |
| 25 | 1546.908367 | 15.000002 | SiO2 | 1.560326 | 95.3 |
| 26 | 100.735080 | 287.184726 | | | 77.3 |
| 27 | 0.000000 | −67.470410 | Mirror | | 71.5 |
| 28 | 1166.218905 | −26.117540 | SiO2 | 1.560326 | 89.9 |
| 29 | 228.675901 | −0.999977 | | | 92.6 |
| 30 | −229.673150 | −62.112757 | SiO2 | 1.560326 | 102.2 |
| 31 | 1651.573796 | −4.139282 | | | 101.4 |
| 32 | −168.631918 | −115.053946 | SiO2 | 1.560326 | 98.5 |
| 33 | −494.607195 | −10.890377 | | | 72.1 |
| 34 | −2693.637221 | −9.999917 | SiO2 | 1.560326 | 71.0 |
| 35 | −182.034682 | −26.163167 | | | 66.3 |
| 36 | 458.881180 | −9.999883 | SiO2 | 1.560326 | 66.6 |
| 37 | −150.000000 | −53.839743 | | | 70.5 |
| 38 | 116.341201 | −37.590742 | SiO2 | 1.560326 | 73.3 |
| 39 | 158.311181 | −1.000526 | | | 96.0 |
| 40 | 540.901698 | −31.553546 | SiO2 | 1.560326 | 112.9 |
| 41 | 236.220218 | −0.999904 | | | 117.3 |
| 42 | −344.717958 | −65.184212 | SiO2 | 1.560326 | 139.6 |
| 43 | 282.807945 | −3.863222 | | | 140.0 |
| 44 | −254.540028 | −48.998341 | SiO2 | 1.560326 | 136.3 |
| 45 | 13988.972761 | −24.472967 | | | 133.8 |
| 46 | 0.000000 | 10.645713 | | | 124.2 |

TABLE 4-continued

NA 1.2
Object height 60
Wavelength 193.306

| | | | | | |
|---|---|---|---|---|---|
| 47 | −159.621355 | −50.079617 | SiO2 | 1.560326 | 115.6 |
| 48 | −320.728784 | −20.982865 | | | 106.5 |
| 49 | −125.755069 | −48.738034 | SiO2 | 1.560326 | 87.2 |
| 50 | −767.843186 | −0.999622 | | | 74.0 |
| 51 | −57.414214 | −57.012850 | SiO2 | 1.560326 | 50.1 |
| 52 | 0.000000 | −1.000000 | H2O | 1.470000 | 16.4 |
| 53 | 0.000000 | 0.000000 | | | |

Aspherical Constants

| Surface | 8 | 15 | 20 | 23 | 25 |
|---|---|---|---|---|---|
| K | 0 | 0 | 0 | 0 | 0 |
| C1 | 6.212168E−08 | −2.065631E−08 | 3.954655E−08 | 4.109750E−08 | 4.109750E−08 |
| C2 | −2.284725E−12 | 1.154467E−12 | −1.975939E−13 | −2.014598E−12 | −2.014598E−12 |
| C3 | 4.919789E−17 | −1.754944E−16 | −2.888308E−17 | 1.434330E−16 | 1.434330E−16 |
| C4 | 1.170467E−20 | −1.439257E−21 | 1.773508E−21 | −1.120664E−20 | −1.120664E−20 |
| C5 | −1.050170E−24 | 4.255683E−25 | −5.791298E−26 | 6.611410E−25 | 6.611410E−25 |
| C6 | 2.860117E−29 | −2.463045E−29 | 9.438651E−31 | −1.801493E−29 | −1.801493E−29 |

| Surface | 33 | 35 | 37 | 40 | 43 |
|---|---|---|---|---|---|
| K | 0 | 0 | 0 | 0 | 0 |
| C1 | −8.304509E−08 | −1.571447E−07 | 1.854475E−07 | 5.368234E−09 | −2.403621E−08 |
| C2 | 3.027151E−12 | −1.893541E−11 | 1.105850E−11 | −9.295068E−13 | −1.650116E−13 |
| C3 | −1.487997E−15 | 2.354878E−15 | −3.337902E−15 | −4.764400E−17 | −1.675626E−17 |
| C4 | 1.391498E−19 | −3.277504E−19 | 5.695337E−19 | −6.981458E−22 | 7.042709E−22 |
| C5 | −5.936943E−24 | 3.740597E−24 | −5.380116E−23 | 5.210284E−26 | −7.079479E−27 |
| C6 | −3.355570E−28 | 3.816347E−27 | 2.436028E−27 | 1.403914E−30 | −9.754026E−32 |

| Surface | 48 | 50 |
|---|---|---|
| K | 0 | 0 |
| C1 | 3.410190E−08 | −1.004308E−07 |
| C2 | −6.659776E−12 | 4.830886E−12 |
| C3 | 4.814964E−16 | −1.220533E−15 |
| C4 | −2.364870E−20 | 1.499788E−19 |
| C5 | 7.232487E−25 | −1.105452E−23 |
| C6 | −9.143981E−30 | 2.727683E−28 |

Decentering and tilt

| Surface | Δx | Δy | Δz | alpha | beta |
|---|---|---|---|---|---|
| 21 | 0 | 0 | 0 | 45 | 0 |
| 27 | 0 | 0 | 0 | 45 | 0 |

TABLE 5

NA 1.2
Object height 60
Wavelength 193.306

| Surface | Radius | Thickness | Material | Refractive index | Half diameter |
|---|---|---|---|---|---|
| 0 | 0.000000 | 50.000000 | | | 60.0 |
| 1 | 0.000000 | 8.000000 | SiO2 | 1.560326 | 75.8 |
| 2 | 0.000000 | 52.869064 | | | 77.4 |
| 3 | 1151.891547 | 30.208455 | SiO2 | 1.560326 | 95.4 |
| 4 | −297.772920 | 3.256949 | | | 97.0 |
| 5 | 392.306364 | 20.384062 | SiO2 | 1.560326 | 99.2 |
| 6 | 2065.429234 | 7.942304 | | | 98.7 |
| 7 | 127.761865 | 45.517258 | SiO2 | 1.560326 | 96.0 |
| 8 | 969.751914 | 34.534602 | | | 92.1 |
| 9 | 72.468670 | 38.613055 | SiO2 | 1.560326 | 62.1 |
| 10 | 73.543725 | 56.553595 | | | 46.3 |
| 11 | −68.108298 | 31.573318 | SiO2 | 1.560326 | 46.0 |
| 12 | −109.674176 | 0.999866 | | | 65.2 |
| 13 | −328.152276 | 23.012797 | SiO2 | 1.560326 | 74.4 |
| 14 | −156.396340 | 49.715086 | | | 79.2 |
| 15 | −201.140848 | 38.713984 | SiO2 | 1.560326 | 98.1 |
| 16 | −122.640971 | 0.999882 | | | 103.2 |
| 17 | 2881.906041 | 35.379085 | SiO2 | 1.560326 | 109.1 |

TABLE 5-continued

NA 1.2
Object height 60
Wavelength 193.306

| | | | | | |
|---|---|---|---|---|---|
| 18 | −269.889474 | 0.999898 | | | 109.8 |
| 19 | 201.477991 | 40.395129 | SiO2 | 1.560326 | 102.2 |
| 20 | −820.910555 | 64.207152 | | | 99.4 |
| 21 | 0.000000 | −272.609099 | Mirror | | 68.5 |
| 22 | 95.391786 | −15.000002 | SiO2 | 1.560326 | 75.6 |
| 23 | 1195.870422 | −32.735719 | | | 93.6 |
| 24 | 150.428374 | 32.735719 | Mirror | | 95.7 |
| 25 | 1195.870422 | 15.000002 | SiO2 | 1.560326 | 93.6 |
| 26 | 95.391786 | 272.609099 | | | 75.6 |
| 27 | 0.000000 | −66.033144 | Mirror | | 69.5 |
| 28 | 1947.063451 | −26.673854 | SiO2 | 1.560326 | 89.0 |
| 29 | 233.589947 | −0.999701 | | | 91.7 |
| 30 | −199.473771 | −82.749765 | SiO2 | 1.560326 | 101.9 |
| 31 | 3119.046646 | −0.999910 | | | 98.4 |
| 32 | −163.659814 | −97.677532 | SiO2 | 1.560326 | 94.7 |
| 33 | −539.497284 | −13.721631 | | | 71.9 |
| 34 | 641.496250 | −9.999860 | SiO2 | 1.560326 | 70.4 |
| 35 | −263.409377 | −22.259722 | | | 65.3 |
| 36 | 545.844495 | −9.999869 | SiO2 | 1.560326 | 65.6 |
| 37 | −150.000000 | −51.094164 | | | 69.1 |
| 38 | 122.880466 | −44.260917 | SiO2 | 1.560326 | 72.0 |
| 39 | 175.327963 | −1.012444 | | | 98.0 |
| 40 | 452.453640 | −29.086710 | SiO2 | 1.560326 | 112.9 |
| 41 | 252.725536 | −0.999886 | | | 117.1 |
| 42 | −302.044457 | −64.007583 | SiO2 | 1.560326 | 139.9 |
| 43 | 305.246700 | −6.812911 | | | 140.0 |
| 44 | −260.892072 | −48.787934 | SiO2 | 1.560326 | 137.1 |
| 45 | −63738.396409 | −13.368774 | | | 134.7 |
| 46 | 0.000000 | 12.334911 | | | 129.6 |
| 47 | −172.500300 | −51.001701 | SiO2 | 1.560326 | 121.3 |
| 48 | −373.082563 | −16.645823 | | | 113.1 |
| 49 | −112.356012 | −65.439167 | SiO2 | 1.560326 | 89.5 |
| 50 | −320.098458 | −1.015712 | | | 65.8 |
| 51 | −54.459312 | −52.887119 | SiO2 | 1.560326 | 47.4 |
| 52 | 0.000000 | −1.000000 | H2O | 1.470000 | 16.4 |
| 53 | 0.000000 | 0.000000 | | | 15.0 |

Aspherical Constants

| Surface | 8 | 15 | 20 | 22 | 23 |
|---|---|---|---|---|---|
| K | 0 | 0 | 0 | 0 | 0 |
| C1 | 6.337290E−08 | −2.289285E−08 | 3.811590E−08 | −1.408703E−08 | 3.501090E−08 |
| C2 | −2.575433E−12 | 1.432217E−12 | −4.102034E−14 | −1.345623E−12 | −1.799694E−12 |
| C3 | 7.627829E−17 | −1.580637E−16 | −3.621641E−17 | −1.762608E−16 | 1.094631E−16 |
| C4 | 1.450407E−20 | −5.394281E−22 | 2.030758E−21 | −3.325862E−20 | −9.420105E−21 |
| C5 | −1.543958E−24 | 3.014031E−25 | −6.452103E−26 | −2.817912E−25 | 6.875122E−25 |
| C6 | 4.707930E−29 | −1.444085E−29 | 1.025805E−30 | −4.961418E−28 | −2.101511E−29 |

| Surface | 25 | 26 | 33 | 35 | 37 |
|---|---|---|---|---|---|
| K | 0 | 0 | 0 | 0 | 0 |
| C1 | 3.501090E−08 | −1.408703E−08 | −3.145690E−08 | −2.578536E−07 | 1.520597E−07 |
| C2 | −1.799694E−12 | −1.345623E−12 | 4.063324E−12 | −2.457425E−11 | 1.942927E−11 |
| C3 | 1.094631E−16 | −1.762608E−16 | −1.462751E−15 | 2.999712E−15 | −4.917419E−15 |
| C4 | −9.420105E−21 | −3.325862E−20 | 7.092121E−20 | −3.983598E−19 | 8.521190E−19 |
| C5 | 6.875122E−25 | −2.817912E−25 | 7.491721E−24 | −1.456563E−23 | −8.041405E−23 |
| C6 | −2.101511E−29 | −4.961418E−28 | −1.243101E−27 | 5.238173E−27 | 3.671590E−27 |

| Surface | 40 | 43 | 48 | 50 |
|---|---|---|---|---|
| K | 0 | 0 | 0 | 0 |
| C1 | −1.092116E−08 | −3.583758E−08 | 4.087867E−08 | −1.635385E−07 |
| C2 | −9.361667E−13 | 3.835468E−14 | −5.710459E−12 | 1.465150E−12 |
| C3 | −4.749385E−17 | −2.007621E−17 | 3.741501E−16 | −2.027656E−15 |
| C4 | −4.357573E−22 | 1.168203E−21 | −1.621453E−20 | 2.148610E−19 |
| C5 | 1.246971E−25 | −2.521599E−26 | 4.063636E−25 | −1.061058E−23 |
| C6 | −1.486578E−30 | 1.420584E−31 | −4.118469E−30 | −6.881746E−28 |

Decentering and tilt

| Surface | Δx | Δy | Δz | alpha | beta |
|---|---|---|---|---|---|
| 21 | 0 | 0 | 0 | 45 | 0 |
| 27 | 0 | 0 | 0 | 45 | 0 |

TABLE 6

NA 1.2
Object height 60
Wavelength 193.306

| Surface | Radius | Thickness | Material | Refractive index | Half diameter |
|---|---|---|---|---|---|
| 0 | 0.000000 | 50.000000 | | | 60.0 |
| 1 | 0.000000 | 8.000000 | SiO2 | 1.560326 | 75.8 |
| 2 | 0.000000 | 50.933772 | | | 77.4 |
| 3 | −727.775952 | 25.801782 | SiO2 | 1.560326 | 91.7 |
| 4 | −216.030845 | 0.999536 | | | 94.2 |
| 5 | 211.040976 | 39.710297 | SiO2 | 1.560326 | 100.0 |
| 6 | −1076.869902 | 0.999021 | | | 98.8 |
| 7 | 112.711195 | 31.326403 | SiO2 | 1.560326 | 87.5 |
| 8 | 214.295126 | 0.999021 | | | 82.2 |
| 9 | 66.802488 | 35.387213 | SiO2 | 1.560326 | 65.6 |
| 10 | 66.108395 | 78.774319 | | | 54.5 |
| 11 | −55.465504 | 9.999279 | SiO2 | 1.560326 | 46.8 |
| 12 | −298.251888 | 8.105868 | | | 72.0 |
| 13 | −253.844073 | 52.611973 | SiO2 | 1.560326 | 80.0 |
| 14 | −100.868104 | 0.999465 | | | 90.1 |
| 15 | −254.089180 | 50.743218 | SiO2 | 1.560326 | 105.4 |
| 16 | −122.616553 | 0.999454 | | | 113.0 |
| 17 | −325.389469 | 35.368071 | SiO2 | 1.560326 | 127.5 |
| 18 | −192.299059 | 0.999384 | | | 130.8 |
| 19 | 857.924664 | 43.506291 | SiO2 | 1.560326 | 134.2 |
| 20 | −402.182966 | 0.999406 | | | 133.9 |
| 21 | 176.032352 | 46.901034 | SiO2 | 1.560326 | 117.2 |
| 22 | 891.737549 | 71.819796 | | | 112.8 |
| 23 | 0.000000 | −160.998496 | Mirror | | 69.5 |
| 24 | −208.477853 | −20.000004 | SiO2 | 1.560326 | 53.4 |
| 25 | −111.736857 | −23.422421 | | | 54.3 |
| 26 | 134.874404 | 23.422421 | Mirror | | 55.0 |
| 27 | −111.736857 | 20.000004 | SiO2 | 1.560326 | 54.3 |
| 28 | −208.477853 | 160.998496 | | | 53.4 |
| 29 | 0.000000 | −65.065512 | Mirror | | 67.8 |
| 30 | 4804.317970 | −34.969769 | SiO2 | 1.560326 | 101.2 |
| 31 | 223.557361 | −0.999140 | | | 104.7 |
| 32 | −647.576916 | −33.517562 | SiO2 | 1.560326 | 114.7 |
| 33 | 511.971879 | −0.999339 | | | 115.8 |
| 34 | −182.695186 | −51.687095 | SiO2 | 1.560326 | 118.0 |
| 35 | −4375.653897 | −0.999619 | | | 115.4 |
| 36 | −131.735101 | −46.203705 | SiO2 | 1.560326 | 97.8 |
| 37 | −1809.243103 | −4.477930 | | | 91.6 |
| 38 | −573.465666 | −9.999876 | SiO2 | 1.560326 | 88.1 |
| 39 | −83.272578 | −56.613234 | | | 66.8 |
| 40 | 99.102012 | −9.999038 | SiO2 | 1.560326 | 66.0 |
| 41 | −124.605516 | −52.681306 | | | 67.0 |
| 42 | 96.638032 | −42.501820 | SiO2 | 1.560326 | 69.1 |
| 43 | 143.757600 | −0.999495 | | | 94.1 |
| 44 | −589.601528 | −42.492551 | SiO2 | 1.560326 | 123.1 |
| 45 | 416.503743 | −0.999625 | | | 125.6 |
| 46 | −393.581824 | −32.891473 | SiO2 | 1.560326 | 135.3 |
| 47 | 929.275942 | −0.999694 | | | 135.2 |
| 48 | −239.988808 | −45.788842 | SiO2 | 1.560326 | 138.8 |
| 49 | −1114.851901 | −57.991878 | | | 136.9 |
| 50 | 0.000000 | 35.538482 | | | 125.2 |
| 51 | −256.373888 | −39.977376 | SiO2 | 1.560326 | 125.8 |
| 52 | −2489.189597 | −0.999817 | | | 122.9 |
| 53 | −112.292298 | −50.358269 | SiO2 | 1.560326 | 100.7 |
| 54 | −179.732403 | −23.614201 | | | 86.6 |
| 55 | −186.994041 | −26.151602 | SiO2 | 1.560326 | 79.8 |
| 56 | 2504.333895 | −0.998913 | | | 74.1 |
| 57 | −52.818237 | −54.338932 | SiO2 | 1.560326 | 47.2 |
| 58 | 0.000000 | −1.000000 | H2O | 1.470000 | 16.4 |
| 59 | 0.000000 | 0.000000 | | | |

Aspherical Constants

| Surface | 8 | 15 | 22 | 24 | 25 |
|---|---|---|---|---|---|
| K | 0 | 0 | 0 | 0 | 0 |
| C1 | 8.438429E−08 | −1.014379E−07 | −9.680776E−10 | 4.589290E−07 | 6.275710E−07 |
| C2 | −2.229236E−12 | 2.468382E−12 | 4.462665E−13 | −3.839142E−11 | −6.326297E−11 |
| C3 | 5.317063E−16 | −1.792692E−16 | 2.908499E−18 | 3.043656E−15 | 7.577756E−15 |
| C4 | −5.325798E−20 | 4.554263E−21 | −1.022012E−21 | 6.631085E−19 | 7.226551E−20 |
| C5 | 5.933879E−24 | −1.724388E−25 | 4.498781E−26 | −2.125048E−22 | −2.141074E−22 |
| C6 | −2.077845E−28 | 5.778429E−31 | −7.354023E−31 | 2.274431E−26 | 2.995536E−26 |

TABLE 6-continued

NA 1.2
Object height 60
Wavelength 193.306

| Surface | 27 | 28 | 37 | 39 | 40 |
|---|---|---|---|---|---|
| K  | 0 | 0 | 0 | 0 | 0 |
| C1 | 6.275710E−07 | 4.589290E−07 | −7.232518E−08 | −3.945726E−08 | −3.396052E−07 |
| C2 | −6.326297E−11 | −3.839142E−11 | −2.217467E−13 | −3.426461E−12 | −1.972920E−11 |
| C3 | 7.577756E−15 | 3.043656E−15 | 2.847604E−16 | −1.874953E−16 | 3.767085E−15 |
| C4 | 7.226551E−20 | 6.631085E−19 | −4.835319E−20 | −1.321859E−19 | −5.439776E−19 |
| C5 | −2.141074E−22 | −2.125048E−22 | 3.646996E−24 | 1.333399E−23 | 2.984282E−23 |
| C6 | 2.995536E−26 | 2.274431E−26 | −1.391467E−28 | −5.465124E−28 | −2.440112E−27 |

| Surface | 44 | 47 | 54 | 56 |
|---|---|---|---|---|
| K  | 0 | 0 | 0 | 0 |
| C1 | −1.325605E−08 | −4.372799E−08 | −7.345028E−08 | −7.547169E−08 |
| C2 | 1.550416E−12 | 8.360768E−13 | −1.135658E−11 | −6.239064E−12 |
| C3 | −6.951071E−17 | −3.668297E−18 | 8.060461E−16 | 1.564526E−15 |
| C4 | 1.294568E−21 | −1.473145E−21 | −1.202219E−19 | −3.045032E−19 |
| C5 | 5.461199E−26 | 7.932242E−26 | 7.589632E−24 | 2.788162E−23 |
| C6 | −2.663009E−30 | −1.459442E−30 | −3.785640E−28 | −1.205165E−27 |

Decentering and tilt

| Surface | Δx | Δy | Δz | alpha | beta |
|---|---|---|---|---|---|
| 23 | 0 | 0 | 0 | 45 | 0 |
| 29 | 0 | 0 | 0 | 45 | 0 |

What is claimed is:

1. A catadioptric projection objective for microlithography for imaging an object field in an object plane onto an image field in an image plane when the object field is illuminated with radiation, comprising:
a first partial objective for imaging the object field onto a first real intermediate image;
a second partial objective for imaging the first intermediate image onto a second real intermediate image, wherein the second partial objective is a catadioptric partial objective having exactly one concave mirror and having at least one lens;
a third partial objective for imaging the second intermediate image onto the image field, the third partial objective comprising an aperture stop and no more than four lenses between the aperture stop and the image plane; and
a first folding mirror for deflecting the radiation from the object plane toward the concave mirror and a second folding mirror for deflecting the radiation from the concave mirror toward the image plane;
wherein the catadioptric projection objective is an immersion projection objective in which during operation an immersion liquid is situated between a last lens surface and the image plane, and
at least one surface of the at least one lens in the second partial objective has an antireflection coating comprising at least six layers.

2. The catadioptric projection objective of claim 1, wherein there are four lenses between the aperture stop and the image plane.

3. The catadioptric projection objective of claim 1, wherein there are three lenses between the aperture stop and the image plane.

4. The catadioptric projection objective of claim 1, wherein the third partial objective comprises at least two negative lenses.

5. The catadioptric projection objective of claim 4, wherein the at least two negative lenses are positioned between the second intermediate image and the aperture stop.

6. The catadioptric projection objective of claim 5, wherein the third partial objective comprises at least one positive lens between the second intermediate image and the at least two negative lenses.

7. The catadioptric projection objective of claim 4, wherein the third partial objective comprises three negative lenses.

8. The catadioptric projection objective of claim 4, wherein the at least two negative lenses are adjacent lenses.

9. The catadioptric projection objective of claim 4, wherein the at least two negative lenses have concave surfaces facing the image plane.

10. The catadioptric projection objective of claim 1, wherein the projection objective has an image-side numerical aperture of at least 1.2 when the immersion liquid is situated between a last lens surface and the object plane.

11. The catadioptric projection objective of claim 1, wherein the six layers of the antireflection coating are composed of layers having differing refractive indices of their adjacent layers at an operation wavelength of the catadioptric projection objective.

12. The catadioptric projection objective of claim 1, wherein the antireflection coating comprising at least six layers is different from any coating on any lens in the first partial objective.

13. The catadioptric projection objective of claim 1, wherein the antireflection coating comprising at least six layers is different from any coating on any lens in the third partial objective.

14. The catadioptric projection objective of claim 1, wherein each lens surface in the second partial objective has an antireflection coating.

15. The catadioptric projection objective of claim 1, wherein the antireflection coating has a reflectivity of less than 0.1% at an operation wavelength of the catadioptric projection objective for an angle-of-incidence range of between 0° and 20°.

16. The catadioptric projection objective of claim 1, wherein the antireflection coating has a reflectivity of less than 0.2% at an operation wavelength of the catadioptric projection objective for an angle-of-incidence range of between 0° and 30°.

17. The catadioptric projection objective of claim 1, wherein the first and third partial objectives share a common straight optical axis.

18. The catadioptric projection objective of claim 1, wherein the concave mirror is arranged in the region of a pupil plane.

19. The catadioptric projection objective of claim 1, wherein
a deviation from a marginal ray concentricity at a surface of the at least one lens in the second partial objective is less than 20°.

* * * * *